United States Patent [19]
Katsumata et al.

[11] Patent Number: 5,851,842
[45] Date of Patent: Dec. 22, 1998

[54] MEASUREMENT SYSTEM AND MEASUREMENT METHOD

[75] Inventors: Ryota Katsumata, Yokohama; Nobuo Hayasaka, Yokosuka; Naoki Yasuda; Hideshi Miyajima, both of Yokohama; Iwao Higashikawa, Tokyo; Masaki Hotta, Sagamihara, all of Japan

[73] Assignee: Kabushiki Kaisha Toshiba, Kawasaki, Japan

[21] Appl. No.: 857,360

[22] Filed: May 15, 1997

[30] Foreign Application Priority Data

May 16, 1996 [JP] Japan .................................. 8-121918
Mar. 18, 1997 [JP] Japan .................................. 9-065147

[51] Int. Cl.$^6$ .................................................. H01L 21/00
[52] U.S. Cl. ................................ 438/9; 156/345; 216/85; 438/14; 438/16
[58] Field of Search ....................... 438/9, 10, 14, 438/16, 17, 18; 156/345 MT; 216/85, 86

[56] References Cited

U.S. PATENT DOCUMENTS 5,322,590   6/1994   Koshimizu ........................ 156/345 X
5,658,418   8/1997   Coronel et al. .................... 438/9 X
5,683,538   11/1997  O'Neill et al. .................... 156/345

OTHER PUBLICATIONS

Jun Kikuchi, et al., "Pulse–Modulated Infrared–Laser Interferometric Thermometry for Si Substrate Temperature Measurement", SPIE Manufacturing Process Control For Microelectronic Devices and Circuits, vol. 2336, pp. 111–119.

Primary Examiner—William Powell
Attorney, Agent, or Firm—Oblon, Spivak, McClelland, Maier & Neustadt, P.C.

[57] ABSTRACT

The measurement system comprises a holder for holding a dielectric film formed on at least a semiconductive substrate and sandwiched between the substrate and a conductive film, voltage application terminals for applying voltage between the substrate and the conductive film, variable voltage source for supplying the voltage to the voltage application terminals, a light source for irradiating the dielectric film with light including wavelength of an infrared region and transmitting the light through the dielectric film, light absorbance detector receiving the light transmitted through the dielectric film, for detecting absorbance of an absorbed light component in an absorption wavelength region intrinsic to the dielectric film, and a potential difference measurement unit for measuring a potential difference between the substrate and the conductive film of the dielectric film on the basis of change in absorbance of the light component when the voltage is changed by the variable voltage source.

22 Claims, 13 Drawing Sheets

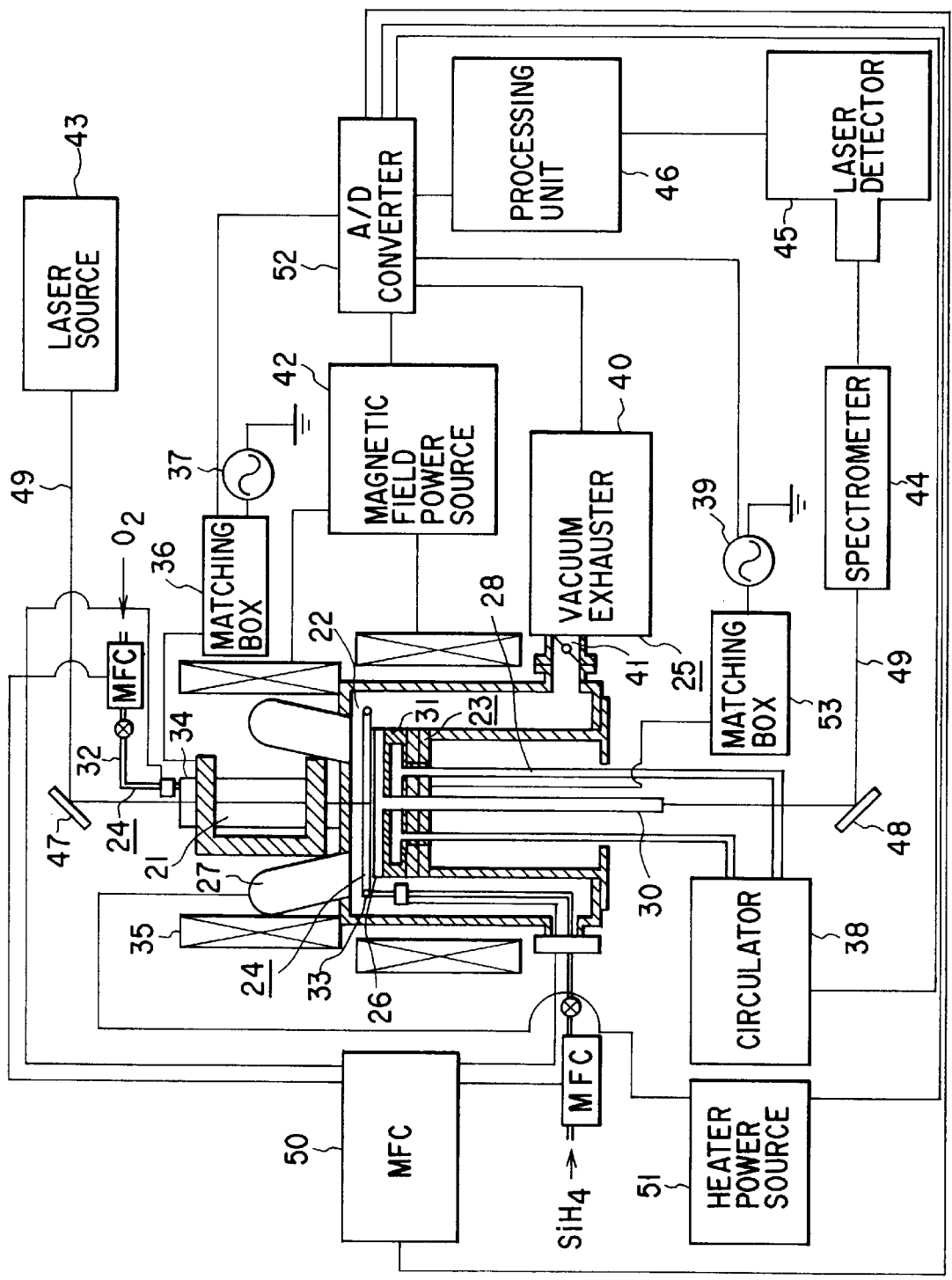
F I G. 5

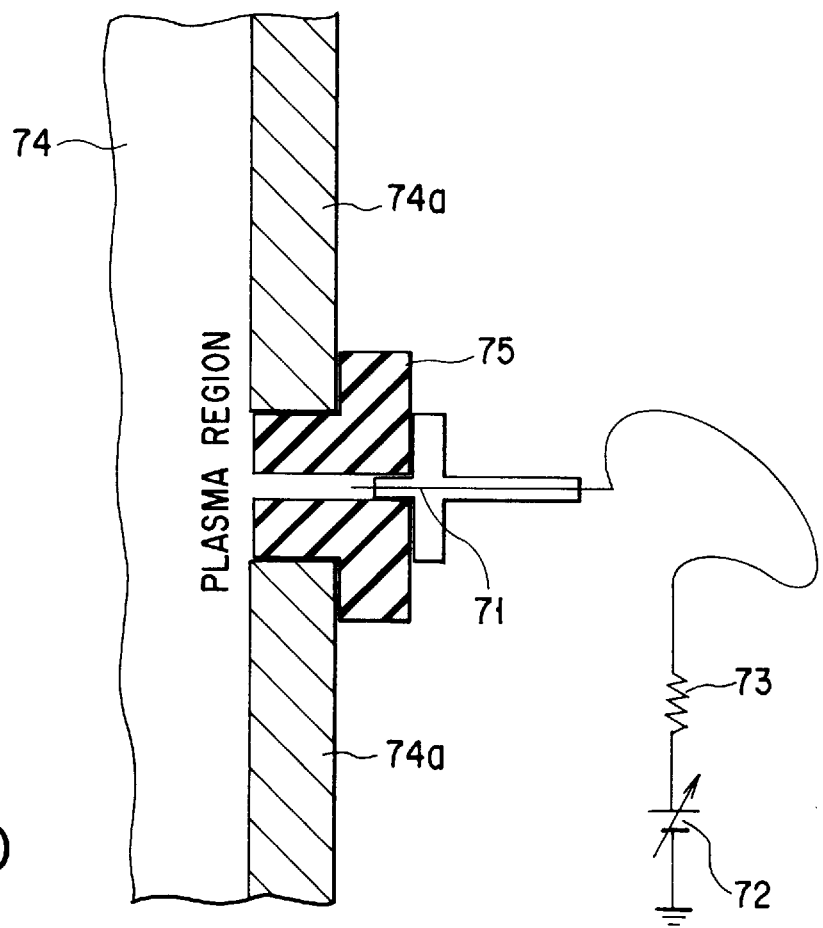
F I G. 10

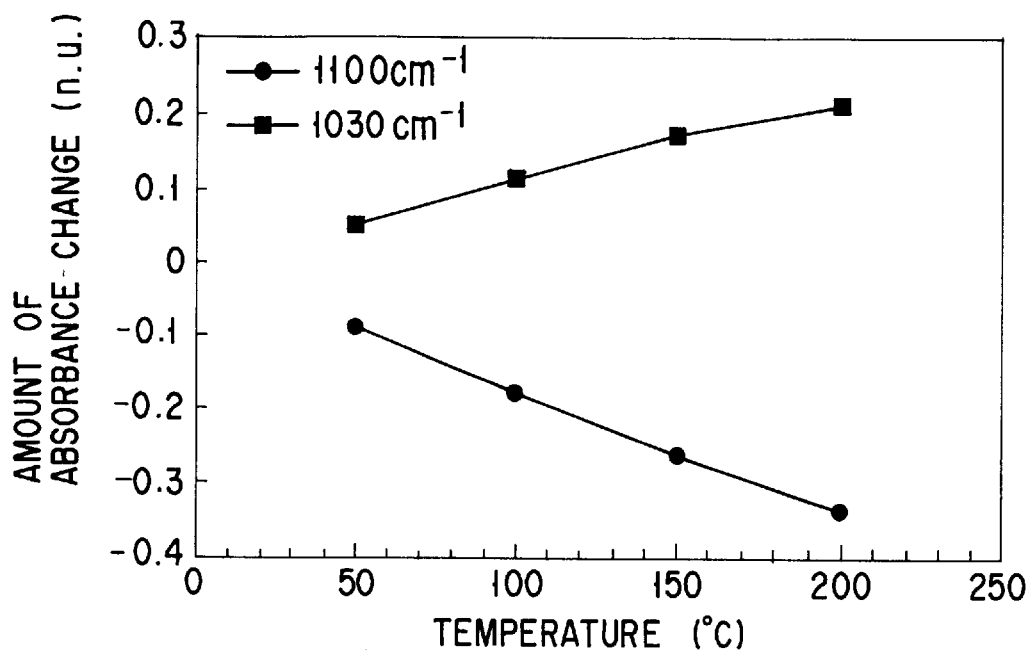
F I G. 14
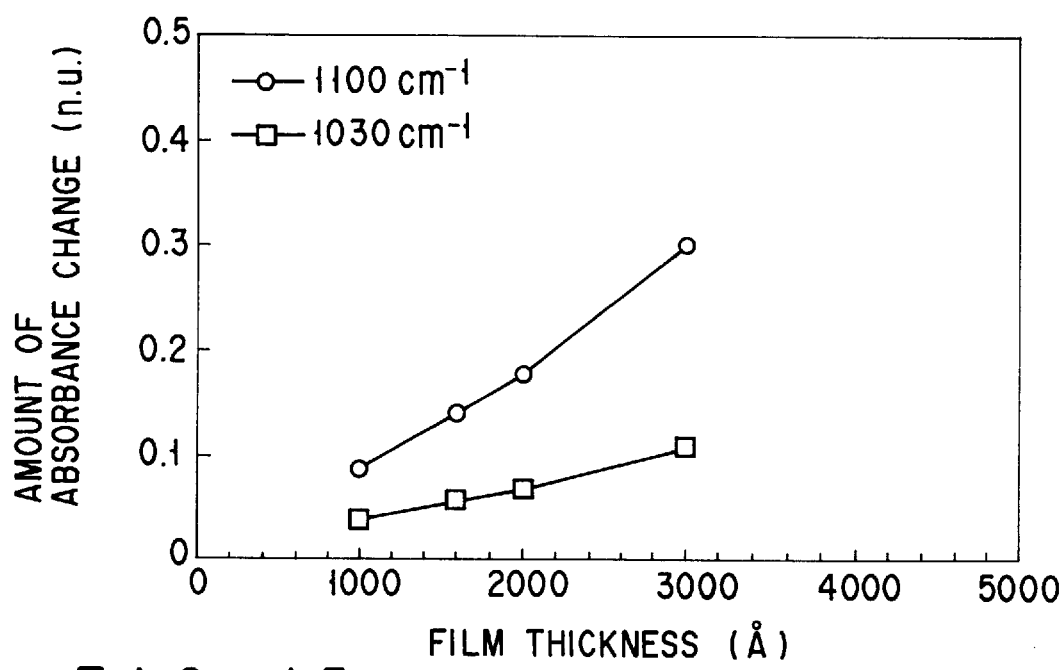
F I G. 15

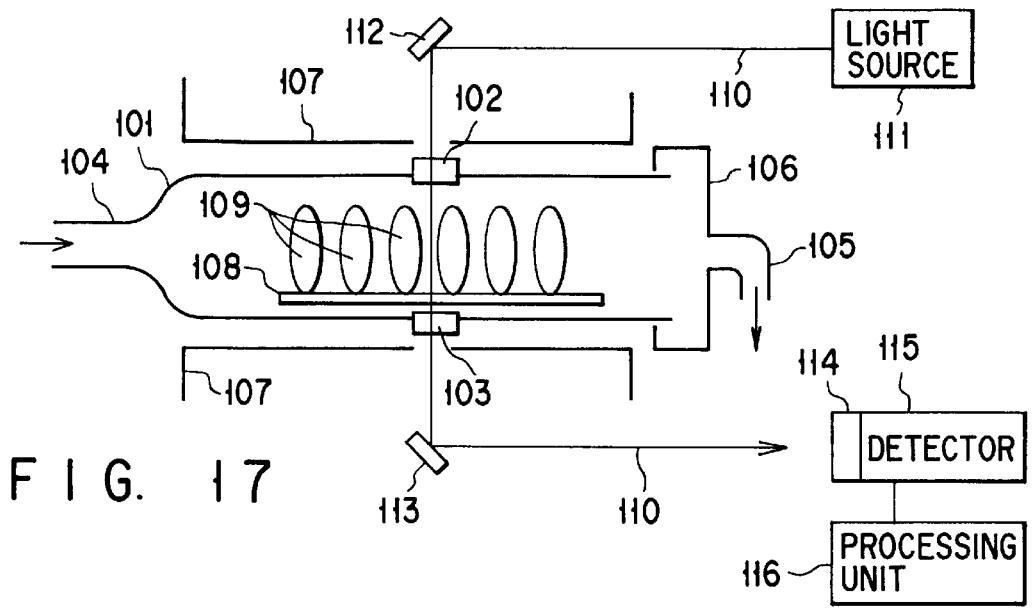
F I G. 17
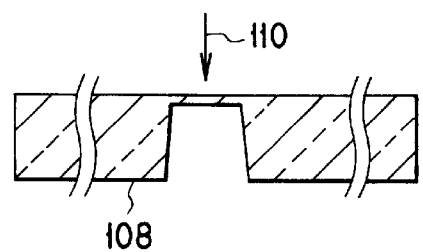
F I G. 18
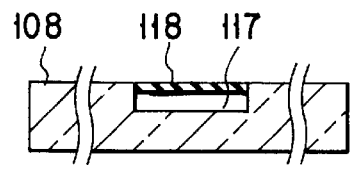
F I G. 20
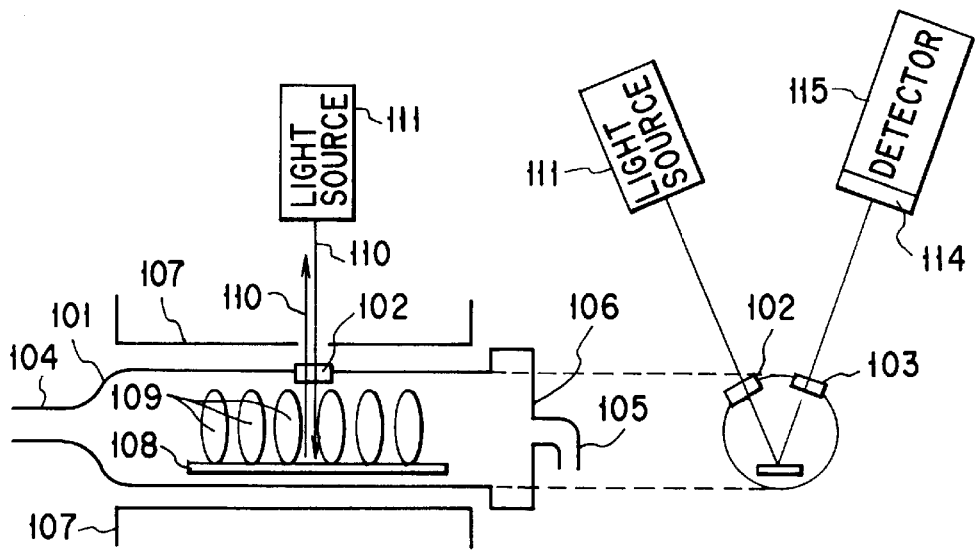
F I G. 19A   F I G. 19B

MEASUREMENT SYSTEM AND MEASUREMENT METHOD

BACKGROUND OF THE INVENTION

The present invention relates to a measurement system and a measurement method, and more particularly, to a measurement system and method effective for plasma treatment.

During the plasma treatment for formation of a dielectric film by a plasma CVD method and the plasma treatment for etching a dielectric film, the dielectric film is exposed to the plasma. While the plasma is maintained at a constant level, the total amount of electric charge flowing into the dielectric film is "0". However, immediately upon the initiation of electric discharge, electrons reach the dielectric film prior to ions since the diffusion coefficient of the electrons is larger than that of ions. As a result, the dielectric film is negatively charged.

Consequently, a negative potential region called sheath region is formed between the dielectric film and the plasma. With the passage of time, the number of electrons rebounded by the negative potential of the sheath region increases until they balance with the ions, reaching-constant conditions.

In the plasma treatment mentioned above, consideration must be given to electric charge consumed in a surface-reaction process. Since SiO can be metastably present with an unpaired electron attached thereto in a silicon dioxide, if electrons are excessively supplied during the film-formation step, defects will be generated in the dielectric film.

To overcome the problem, the charge amount of the dielectric film must be determined. One might consider that the charge amount of the dielectric film can be determined by a sheath potential if measured, since the sheath potential changes correlating with the consumption of electric charge in the aforementioned process. However, even if the excessively-supplied electrons are consumed in the film-formation step and in the etching step, electrons are continuously supplied from the plasma all the time. The consumed electrons are off set in this manner and the sheath potential returns to the original state at last. Hence, the charge amount cannot be determined by sheath potential.

When the dielectric film is electrically charged during the plasma treatment, notching and shouldering problems take place in an etched portion while narrow grooves and small holes are formed in the dielectric film by etching.

FIG. 1 shows a profile of a notching and shouldering observed on a silicon oxide ($SiO_2$) film 192 formed on a silicon substrate 191, during the plasma etching. When the silicon oxide film 192 is electrically charged by exposing a plasma, an electric field near the surface of the substrate is changed. As a result, ions to be injected in the silicon substrate 191 are turned in proceeding course and etch the side wall of the grooves and holes abnormally, producing the notching and shouldering.

When the plasma treatment is applied to a substrate to be treated (treatment substrate) having a gate structure formed thereon, the gate electrode exposed to the plasma is destroyed by electric charge accumulated thereon. In particular, the destruction of gate electrode more frequently occurs in the case where the electric field is not uniformly applied onto the surface of the substrate.

To overcome the various problems mentioned above accompanied with the plasma treatment, it is proposed that the charge amount of a dielectric film is measured by a method employing a small capacitor in the dielectric film. In this method, the charge amount can be measured by soaking the dielectric film having a small capacitor in a plasma, and then discharging the electric charge stored in the capacitor.

However, in this method, it is theoretically difficult to measure the charge amount of the dielectric film, while the plasma is being discharged. Furthermore, it is not preferable to form a capacitor in the dielectric film since the capacitor is not an originally indispensable member for the treatment substrate, insulation film.

Another method is proposed. This is a method employing a detection electrode provided to the dielectric film. The charge amount is simply measured by the detection electrode when the charge accumulated on the dielectric film flows in the detection electrode. This method is also not preferable since the detection electrode inherently unnecessary, is provided to the dielectric film.

On the other hand, to obtain a film with an excellent quality and excellent etching figure, a type of gas must be appropriately chosen and optimal process parameters including a gas flow rate, a gas pressure, an RF application power for generating a plasma, and an apparatus structure, must be appropriately optimized in the plasma treatment processes such as the plasma CVD and the reactive ion etching. However, since the optimization of the process parameters has been performed depending on empirical procedures, a great deal of time and labor have been spent to find optimal values from various process parameters.

The process parameters are varied with time since side-products and a film-formation materials are absorbed or desorbed onto the wall of a vacuum chamber. Due to the absorption/desorption phenomenon, the resultant films differs in quality and etching figure even if the film-formation is made under the same process conditions.

To overcome these problems, various chamber cleaning methods and chamber cleanness (contamination level) monitoring methods have been proposed. Of them, a probe method is known as a convenient method performed at a relatively inexpensive cost.

The method employing a probe (probe method) was developed by Langmuir in 1923. Since then, the probe-measuring method has been widely used and are used even at present as the most principle method for plasma diagnosis by virtue of its convenience and usefulness. However, there is a problem in the probe method. When a probe is applied to plasma treatment system for the plasma CVD method, plasma etching method and the like, a reaction product is deposited on the surface of the probe, inhibiting the detection of a probe current. This is because the probe current is sensitive to the cleanness of the probe but the cleanness of the chamber inner wall is not so high.

The probe-measuring method is explained in "Fundamental and Application of Process Plasma", (in the 7th lecture meeting) published by Society of Plasma and Nuclear Fusion. The brochure teaches a method of preventing deposition of reaction products, a method of increasing a probe temperature by laser radiation to the probe surface, and a method of retarding the deposition of the reaction products by pulsation of a plasma discharge.

In the method of heating a probe by use of a laser, a carbon dioxide gas laser must be used as a high-power laser source. However, if this method is applied to a process in practice, the manufacturing cost inevitably increase because the carbon dioxide gas laser is expensive. On the other hand, in the method employing the pulse discharge, a film formation speed during plasma treatment decreases.

Furthermore, conventional plasma treatments accompany the following problems. When thin-film deposition is performed by use of a high-density plasma, the surface temperature of a substrate increases because of high-energy ions incident on the surface of a treatment substrate from the plasma. Since the substrate temperature increases during the plasma treatment, the film-formation rate at the end of film-formation differs from that at the beginning.

The substrate temperature and film-formation rate are largely rely upon an impurity content in a $SiO_2$ film and an withstanding voltage of the $SiO_2$ film employed as an interlayer insulation film and a gate oxidation film. It is therefore important to measure the substrate temperature and film thickness (film-formation rate) while the film-formation is carrying out.

The measurement of substrate temperature is also required when a semiconductor wafer is cleaned, as explained below.

Recently, a semiconductor integrated circuit has been accelerated toward high density integration. To improve the reliability of the semiconductor integrated circuit, it is desired to improve electric properties by removing contaminants such as heavy metals, light metals incorporated into the interior portion of the semiconductor device.

This is because if the contaminants such as heavy metals are introduced into the interior portion of the semiconductor substrate during the manufacturing steps of a semiconductor device, a trap center for holes is formed and pn-junction current leakage is produced, with the result that electric properties of the semi-conductor element deteriorate, decreasing performance of the device.

More specifically, if heavy metals such as Fe, Ni, Cu, and Au are introduced into the interior of a silicon substrate in DRAM, a MOS transistor formed on the substrate surface reduces in life time and in a memory holding time. If the heavy metals are introduced into a gate oxidation film, a defect density increases, degrading electric properties such as insulation voltage of the gate oxide film and current leakage.

The surface cleaning methods for a semiconductor substrate (wafer) used in the manufacturing steps of a semiconductor device are classified into wet cleaning methods and dry cleaning methods. However, the conventional wet cleaning methods have a problem in that contaminant metals of $10^9$–$10^{12}$ atom/cm$^2$ are absorbed to a semiconductor substrate by reason of a purity of a cleaning solution and reverse absorption of the contaminant metals to the semiconductor substrate.

As the conventional dry cleaning method, known is a single wafer processing method which employs a chloride gas, a silicon base gas, or the like as reaction species relative to the contaminant metal. However, the dry cleaning method is a single wafer processing method performed in a vacuum. Hence, the throughput is low.

As a conventional technique for forming a clean oxide film on the surface of a silicon substrate, a thermal oxidation method using hydrogen chloride gas (hydrochloric acid oxidation method) is known. In the hydrochloric acid oxidation method, contaminant metals on the substrate surface are gettered into a gas phase. However, contaminant metals are removed from the silicon substrate surface into the gas phase in some cases, and diffused into the silicon substrate in other cases, depending upon thermal oxidation conditions employed in the hydrochloric oxidation method. It is therefore difficult to remove the contaminant metals from the silicon substrate effectively.

When the dielectric film (an oxide film, a nitride film etc.) formed by a vapor-phase epitaxial growth method (CVD method, etc.), is processed by the RIE method, the contaminant metals present in an RIE chamber are adhered onto the dielectric film and incorporated thereinto.

The majority of contaminant metal adhered on the surface of the dielectric film can be removed by the wet cleaning. However, complete cleaning of the surface of the dielectric film cannot be made because of problems associated with a purity of a cleaning liquid and adverse-absorption. The contaminant metal incorporated into the dielectric film cannot be removed by the wet cleaning accompanying no etching step.

As a simple and effective dry cleaning method for a semiconductor device, capable of gettering the contaminant metals generated during an element formation step into a gas phase, known is a thermal treatment method carried out in a non-oxidative ambient containing halogen or a halogen compound.

As the halogen, for example, $Cl_2$ or the like is used. Examples of the halogen compound include HBr, HCl, $CCl_4$ $C_2HCl_3$ and the like. As the non-oxidative gas for the non oxidative ambient, use may be made of a nitride gas or an inert gas such as argon or helium.

The thermal treatment temperature must be set to a temperature equal to or more than the temperature at which contaminant metals react with halogen. On the other hand, when the surface of a semiconductor substrate or a native oxide film is exposed in a gas phase, the thermal treatment must be performed at 600° C. or less.

This is because when the thermal treatment is carried out at a temperature exceeding 600° C. in a non-oxidative ambient containing halogen or a halogen compound, the semiconductor substrate is etched by, for example, a hydrochloric acid, generating many etch pits on the substrate surface.

Therefore, when the dry cleaning method of this type is employed, the thermal oxidation must be performed at a temperature within the range from the temperature at which contaminant metals react with a halogen to 600° C., preferably, at a temperature of 500° C. or less. To control the temperature, the measurement of substrate temperature must be performed.

The measurement of substrate temperature is also required at the time a photoresist pattern is formed, as explained below.

The photoresist pattern is formed by electron beam radiation in accordance with the following steps. For example, a chemical sensitization photoresist is applied onto a quartz substrate. Then, an electron beam is directed to the photoresist to generate acid from the electron-beam directed portion of the photoresist. The resultant construct is subjected to the baking treatment called PEB (Post Exposure Bake) treatment which induces an acid catalyst reaction of the chemical sensitization series resist.

In the PEB treatment, when the treatment is performed at higher temperature, the acid catalyst accelerates the resist decomposition and facilitates diffusion of the acid catalyst. The diffusion of the acid catalyst further facilitates the decomposition of photoresist except for the electron beam irradiated portion. When the diffusion of the acid catalyst is made excessively, a spot is generated in the exposure pattern.

Hence, it is important to perform the PEB treatment in the temperature range allowing sufficient photoresist decomposition and limiting the acid catalyst diffusion to a minimum level. For these reasons, the measurement of substrate temperature is required also in the PEB treatment.

Recently, to reduce a production cost, the size of a wafer tends to be larger. To save the production cost, it is also preferred that a large number of wafers be treated simultaneously in a single step of oxidation or diffusion heat treatment. In consideration of such production cost, application of a batch-type heating apparatus is preferable.

In the batch-type heating apparatus, a wafer is heated not only by radiant heat from the side face of a heating furnace but also by thermal conduction. If a temperature is raised at a high speed, the temperature of the center significantly differs from that of the periphery of the wafer, with the result that a slip or the like is formed in the wafer during the temperature increase. Particularly in the case where a large wafer exceeding 12 inch is used, it is difficult to obtain a uniform temperature distribution.

In the heating process requiring temperature up and down for a short time, for example, in a post implantation annealing step for activating ions, a heating furnace for single wafer processing is used.

However, even if a single wafer heating apparatus is used, the temperature distribution of a wafer surface is influenced by gas pressure, temperature-raising time, temperature, heating method, and the like. In this case, it is very difficult to carry out heating with good reproducibility unless any improvement is made. Hence, the measurement of substrate temperature is also required in the rapid temperature up and down process.

As is described above, it is essential to measure the substrate temperature in various steps in a semiconductor manufacturing process. As the substrate-temperature measurement method, a method using a thermocouple is generally known. However, the measuring method using a thermocouple, has the following problems since the thermocouple is in contact with a treatment substrate.

First, accurate temperature measurement is difficult since a heat capacity of the thermocouple itself cannot be ignored. To generate a high-density plasma, a high power RF is used. Therefore, the thermocouple is heated by the treatment with the high-power RF. Because of these problems, it is difficult to measure the treatment substrate accurately. Hence, the non-contact measurement system for a substrate temperature is desired.

As the non-contact measurement system, Kikuchi et al. have reported a method by use of the phenomenon that refractivity of a treatment substrate varies a depending on the temperature of a substrate (SPI vol. 2336, pp 111–119, 1994).

However, since this method employs laser coherence, higher techniques such as a pulsation of laser and phase measurement are required, complicating the equipment. Furthermore, in this method, film thickness cannot be measured together with the substrate temperature. When an artisan wants to measure the substrate temperature and film thickness simultaneously, a tool for measuring film thickness must be prepared separately. As a result, the entire measuring system becomes complicated, increasing a cost.

BRIEF SUMMARY OF THE INVENTION

A first object of the present invention is to provide a novel measurement method for measuring electric charge amount accumulated on a dielectric film by plasma treatment without forming an inherently-unneccessary construct for charge detection such as a capacitor in the dielectric film.

A second object of the present invention is to provide a probe measurement method inviting no cost increase and no decrease in plasma treatment rate.

A third object of the present invention is to provide a simple measurement system capable of measuring temperature and film-thickness of a treatment substrate exposed to a plasma in a non contact manner with the treatment substrate.

To attain the aforementioned objects, the measurement system according to a first aspect of the present invention comprises:

holding means for holding a dielectric film formed on at least a semiconductive substrate and sandwiched between the substrate and a conductive film;

voltage application means for applying voltage between the substrate and the conductive film;

variable voltage source for supplying the voltage to the voltage application means;

light radiation means for irradiating the dielectric film with light including wavelength of an infrared region and transmitting the light through the dielectric film;

light absorbance detection means receiving the light transmitted through the dielectric film, for detecting absorbance of an absorbed light component in an absorption wavelength region intrinsic to the dielectric film; and potential difference measurement means for measuring a potential difference between the substrate and the conductive film of the dielectric film on the basis of change in absorbance of the light component when the voltage is changed by the variable voltage source.

The measurement method according to the first aspect of the present invention comprises the steps of:

applying voltage to a dielectric film sandwiched between at least a semiconductive substrate and a conductive film;

irradiating the dielectric film with light including wavelength of an infrared region and transmitting the light through the dielectric film;

receiving the light transmitted through the dielectric film and measuring absorbance of the light; and measuring a potential difference between the substrate and the conductive film of the dielectric film on the basis of change in absorbance of the light within an absorption wavelength range intrinsic to the dielectric film when the voltage is changed.

The dielectric film held by the holding means is desired to contain one element selected from the group consisting of silicon dioxide, silicon nitride, silicon carbide, aluminum oxide, zirconium oxide, cupric oxide and tungsten oxide.

The conductive film is desired to have a transmittance to the light within absorption wavelength region intrinsic to the dielectric film which is $1/20$ or more of transmittance to the light including the absorption wavelength region.

In the case where a $SiO_2$ film is used as the dielectric film, the intrinsic absorption wavelength region is one including an absorbance peak of a Si—O—Si antisymmetric stretching vibration. As the light absorbance detection means, for example, an infrared spectrometer is used.

The measurement system according to a second aspect of the present invention comprises:

plasma treatment means for applying a predetermined plasma treatment to a dielectric film on a substrate by use of plasma, the plasma treatment means having an electrode serving as a susceptor on which the substrate is to be mounted;

light radiation means for irradiating the dielectric film with light including wavelength of an infrared region and transmitting the light through the dielectric film;

light absorbance detection means for detecting absorbance of light within an absorption wavelength region intrinsic to the dielectric film of the light absorbed in the dielectric film; and potential difference measurement means for measuring a potential difference of the dielectric film charged with the plasma, on the basis of a difference in the light absorbance between before plasma treatment and during the plasma treatment.

It is desirable that the plasma treatment means have an RF power source for plasma generation and the RF power source supplies a pulse-form RF power having a pulse interval controlled on the basis of measurement results by the potential difference measurement means.

The plasma treatment means is desired to treat a dielectric film containing one element selected from the group consisting of silicon dioxide, silicon nitride, silicon carbide, aluminum oxide, zirconium oxide, cupric oxide and tungsten oxide.

The dielectric film desirably has a transmittance to the light within an absorption wavelength region intrinsic to the dielectric film which is 1/20 or more of transmittance to the light including the absorption wavelength region.

In this case, light amount necessary for measurement is absorbed by the dielectric film. Hence, accurate measurement can be performed.

The measurement method according to the second aspect of the present invention comprises the steps of:

irradiating a dielectric film with light including wavelength of infrared region; and measuring a potential difference of the dieletric film charged with plasma on the basis of change in absorbance of the light within an absorption wavelength range intrinsic to the dielectric film, among the light absorbed by the dielectric film.

In the case where a $SiO_2$ film is used as the dielectric film, the aforementioned conditions can be basically satisfied. However, if the film is too thick, it is difficult to measure the potential difference. In this case, it is better to increase the intensity of light.

The measurement system according to a third aspect of the present invention comprises:

a current detection electrode exposed in an interior of a plasma treatment chamber for performing plasma treatment and electrically isolated from the plasma treatment chamber, the plasma electrode being applied with a negative voltage;

an insulation member electrically isolating the current detection electrode from the plasma treatment chamber and arranged around the current detection electrode to prevent the current detection electrode from being exposed to a material present in the plasma treatment chamber; and contaminant measuring means for measuring an amount of contaminant present in the plasma treatment chamber on the basis of current detected by the current detection electrode.

It is desirable that the insulation member has a transmission hole communicating between an interior portion and an exterior portion of the plasma treatment chamber, the current detection electrode is inserted from the exterior portion through the transmission hole in such a manner that a distal end of the current detection electrode is allowed to remain in the transmission hole.

The diameter of the transmission hole is desired to be equal to or longer than a debye length of a reaction species generating plasma, and a distance between the distal end of the current detection electrode and an inner wall of the plasma treatment chamber is equal to or more than a mean free path of the reaction species.

The measurement method according to the third aspect of the present invention comprises the steps of:

preparing a current detection electrode in an interior portion of a plasma treatment chamber for performing plasma treatment in such a manner that a distal end of the electrode is exposed in a transmission hole in an insulation member, the current detection electrode being charged with a negative voltage to the plasma treatment chamber; and measuring a contamination amount in the plasma treatment chamber on the basis of current detected by the detection electrode while deposition of a material present in the plasma treatment chamber on the current detection electrode is being prevented by inserting the current detection electrode into the transmission hole formed of the insulation member.

The insulation member used herein preferably forms a structure capable of preventing diffusion of the material present in the plasma treatment chamber into the current detection electrode. It is desirable that heating means be provided to the current detection electrode and the insulation member. It is also preferable that the electrode and insulation member have driving means capable of changing the distance to the plasma.

The measurement system according to a fourth aspect of the present invention comprises:

light radiation means for irradiating a treatment substrate with light including wavelength of an infrared region;

temperature/film-thickness measurement means for measuring temperature and film-thickness of the treatment substrate simultaneously, the temperature being measured on the basis of change in wavenumber of absorption peak within an absorption wavelength region intrinsic to the treatment substrate, among the light absorbed by the treatment substrate, and previously-prepared data regarding temperature dependency of an absorption spectrum with respect to the treatment substrate, and the film-thickness being measured on the basis of change in absorbance of light within the absorption wavelength region intrinsic to the treatment substrate and previously-prepared data regarding film-thickness dependency of absorption spectrum with respect to the treatment substrate.

It is desirable that the light radiation means irradiate anyone of the treatment substrate containing silicon, the treatment substrate containing silicon and oxygen, and the treatment substrate containing silicon and nitrogen with the light.

The measurement method according to a fifth aspect of the present invention comprises the steps of:

light radiation means for irradiating a treatment substrate with light including at least two wavelengths of an infrared region; and a temperature measurement means for measuring the treatment substrate on the basis of change in absorbance of light containing at least two wavelengths in an absorption wavelength region intrinsic to the treatment substrate, among the light absorbed in the treatment substrate, and on the basis of previously prepared data regarding temperature dependency of absorption spectra of at least two light wavelengths absorbed by the treatment substrate.

The measurement system further comprises previously-prepared data regarding film-thickness dependency of absorption spectra of at least two light wavelengths absorbed by the treatment substrate, and may further comprises film-thickness measurement means for measuring film-thickness of the treatment substrate.

It is preferred that the light including at least two wavelengths of an infrared region includes a light having a wavenumber exceeding 1080 cm$^{-1}$ and a light having a wavenumber of 1080 cm$^{-1}$ or less, and the treatment substrate is formed of a thin film containing silicon and oxygen.

Furthermore, the light including at least two wavelengths in an infrared region may be a light having a wavenumber exceeding 1100 cm$^{-1}$ and a light having a wavenumber of 1080 cm$^{-1}$, and the treatment substrate may be formed of a thin film containing silicon and oxygen.

The present inventions have intensively studied on the infrared absorption spectrum of the dielectric film by directing light containing wavelength of an infrared region to the dielectric film. As a result, they found the following new facts.

The wavenumber of an absorbance peak in the absorption wavelength region intrinsic to the dielectric film shifts as the application voltage to the dielectric film changes. Therefore, potential difference can be obtained from change in light absorbance of the intrinsic absorption wavelength region.

According to the first aspect of the present invention, by virtue of the potential difference obtained from the amount of change in light absorbance of intrinsic absorption wavelength region, the amount of electric charge accumulated on the dielectric film by a plasma can be measured without construction of inherently unessential charge amount detector, such as a capacitor, in the dielectric film.

Since measurement relies on light absorbance, non-contact measurement can be carried out during plasma treatment. Therefore, the control of the plasma treatment can be improved. The dielectric film as well as a treatment substrate are prevented from damages with electrification. Consequently, quality of the treatment substrate is improved.

According to the third aspect of the present invention, in order to electrically isolate a current detection electrode from a plasma treatment chamber, reaction products are prevented from depositing on the current detection electrode by designing the structure (shape, dimensions) of the insulation member ingeniously. Hence, the measurement system is free from a problem of cost increase as is in a conventional method using laser and a problem of decrease in plasma treatment rate as is in a conventional method employing pulsation of a plasma discharge.

According to the fourth and fifth aspects of the present invention, the temperature and film thickness of a treatment substrate can be measured simultaneously by a single temperature and film/thickness measurement means by use of previously-prepared data regarding the temperature dependency and film-thickness dependency of an absorption spectrum.

The present invention uses light absorption, non-contact measurement is attained during the plasma treatment. If the plasma treatment of a substrate is carried out by use of the present invention, the control of the plasma treatment can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 5 is a schematic diagram of a helicon wave excitation plasma CVD system equipped with a charge amount detection function, according to Embodiment 2 of the present invention;

FIG. 10 is a cross sectional view of a contaminant measuring apparatus according to Embodiment 3 of the present invention;

FIG. 14 is a characteristic diagram showing change in absorption at wavenumbers 1100 cm$^{-1}$ and 1030 cm$^{-1}$ relative to temperature change;

FIG. 15 is a characteristic diagram showing change in absorption at wavenumbers 1100 cm$^{-1}$ and 1030 cm$^{-1}$ relative to film thickness change;

FIG. 17 is a schematic view of a dry cleaning equipment equipped with temperature measuring function according to Embodiment 7 of the present invention;

FIG. 18 is an enlarged cross sectional view of a quartz board 108 of the dry cleaning equipment of FIG. 17;

FIG. 19A is a schematic view of a modified example of the dry cleaning equipment equipped with temperature measuring function according to Embodiment 7 of the present invention;

FIG. 19B is a cross sectional view of the dry cleaning equipment of FIG. 19A seeing from the cap 106 side;

FIG. 20 is an enlarged cross sectional view of a quartz board 108 of the dry cleaning equipment of FIG. 19;

DETAILED DESCRIPTION OF THE INVENTION

Hereinbelow, embodiments of the present invention will be explained with reference to the accompanying drawings.

(Embodiment 1)

Figure 1:
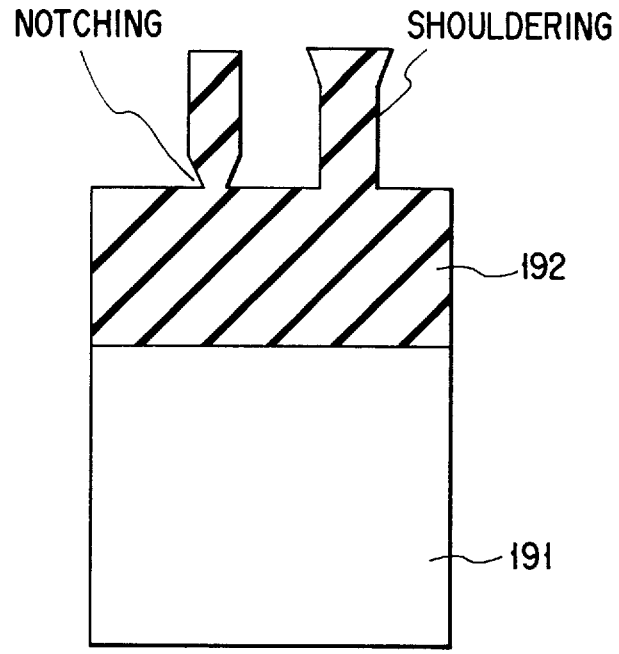
FIG. 1 is a view showing a notching and shouldering of a silicon oxide film taking place during a conventional plasma etching.
Figure 2:
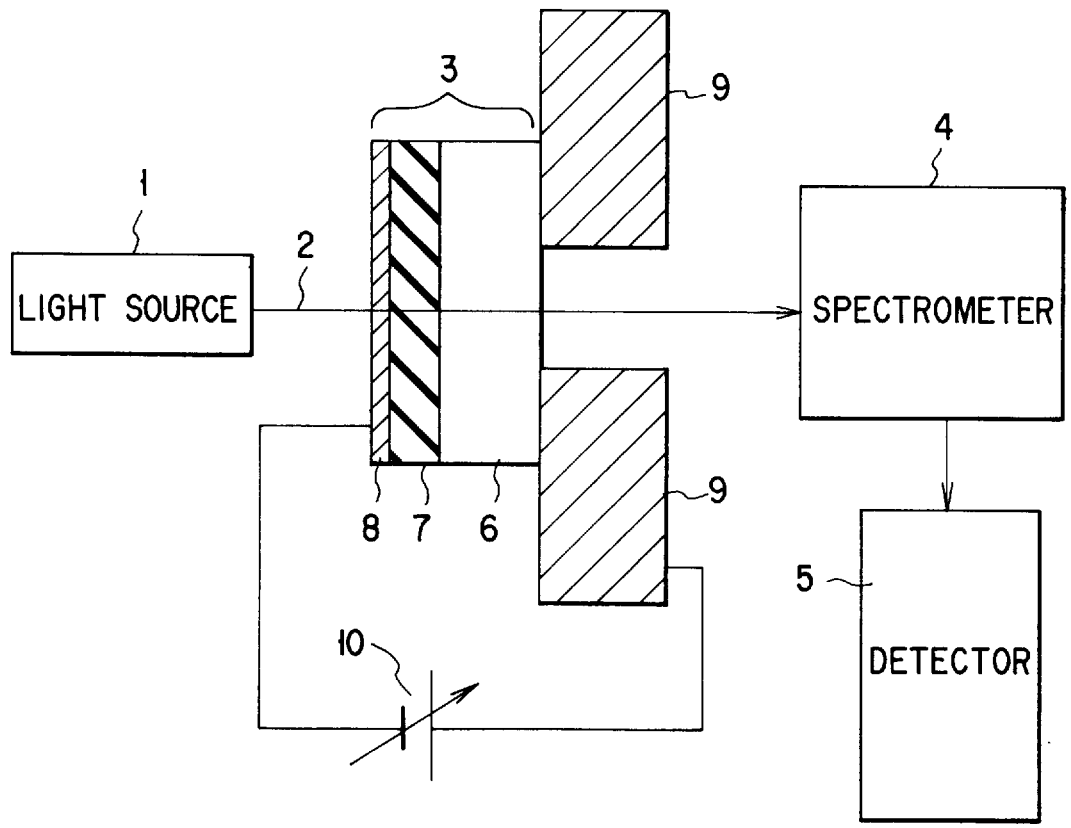
FIG. 2 is a schematic diagram of a measurement system used in Embodiment 1 of the present invention.

FIG. 2 is a schematic diagram of a measurement system used in experiments by the present inventors. A light source 1 emits light 2 including wavelengths of an infrared regions toward a sample 3. The light 2 transmitted through the sample 3 enters a detector 5 by way of a spectrometer 4. The spectrometer 4 and the detector 5 are constituents of an infrared spectrometer. The sample 3 comprises a silicon substrate 6, a $SiO_2$ film 7 (1 μm or less in thick) formed on the silicon substrate 6, and a polycrystalline silicon film 8 (380 nm thick) highly doped with boron serving as an electrode, and formed on the $SiO_2$ film 7.

The sample 3 is mounted on a susceptor 9 serving as an electrode. The susceptor 9 and the polycrystalline silicon film 8 are connected with a variable voltage generation source 10 interposed therebetween. A bias voltage can be supplied to the sample 3 by the variable voltage generation source 10.

Figure 3:
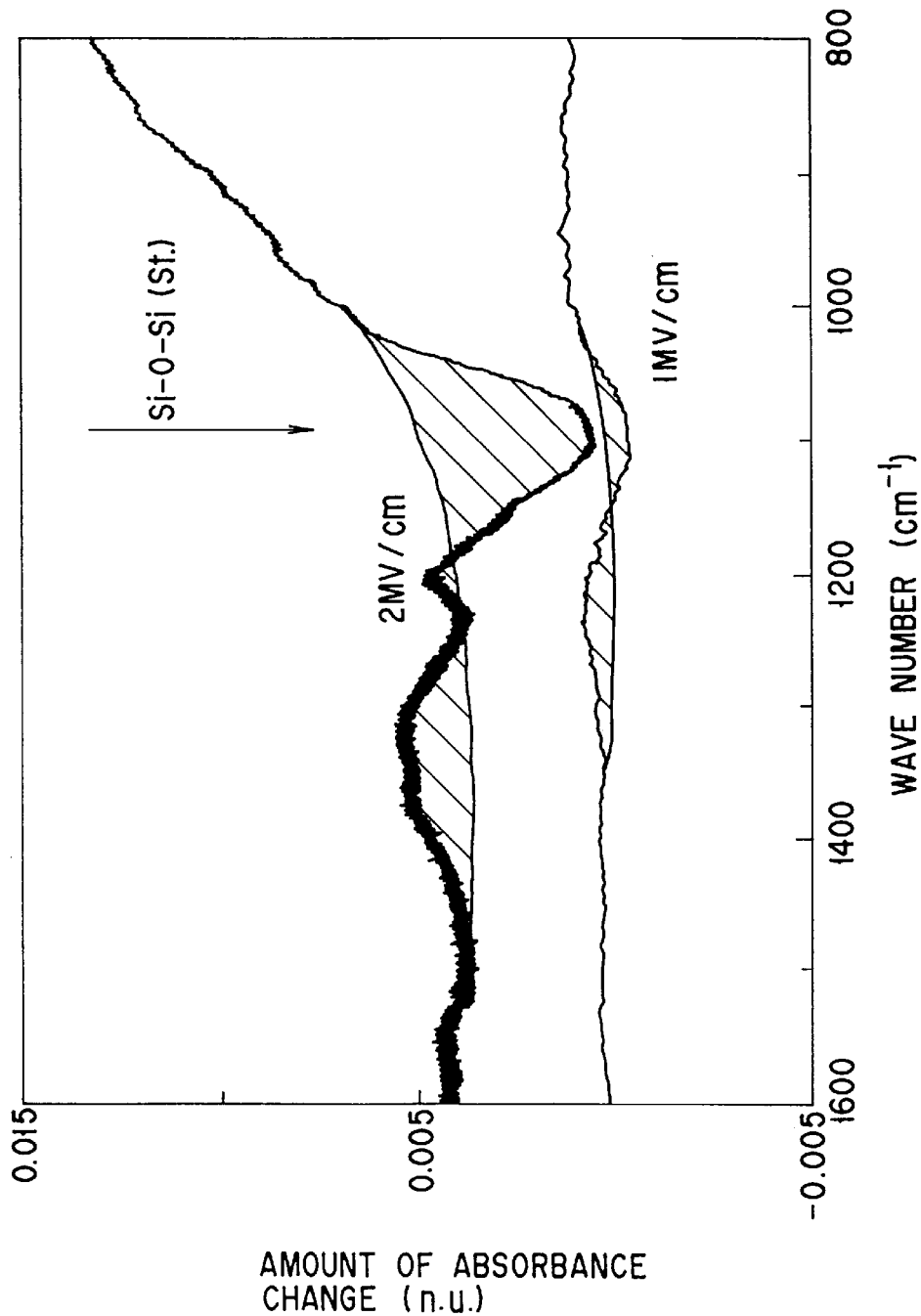
FIG. 3 is a graph showing change in absorbance peak (about 1070 cm$^{-1}$) of Si—O—Si symmetric stretching vibration of a SiO$_2$ film when a bias voltage is applied.

FIG. 3 is a graph showing absorbance change around absorbance peak (about 1070 $cm^{-1}$) of Si—O—Si antisymmetric stretching vibration of a $SiO_2$ film when a bias voltage is applied. In other words, absorbance change in the intrinsic absorption range to the $SiO_2$ film 7, is measured. FIG. 3 shows cases where two bias voltages are applied so as to obtain electric fields, 2 MV/cm and 1 MV/cm across the $SiO_2$ film 7. Note that absorbance change refers to a value obtained by subtracting the absorbance at the time no bias voltage is applied from the absorbance at the time the bias voltage is applied.

From the measurement results, it was found that an absorbance peak of a Si—O—Si antisymmetric stretching vibration shifts toward a large wavenumber side. Experiments were further carried out and found that the relationship between an electric field E (MV/cm), and the area S, which is difference in area the absorbance peaks of the $SiO_2$ film 7 before and after the shift, can be expressed by the following equation:

$$E = A \times S$$

where A is a coefficient from 1 to 3.

The area of the absorbance peak is defined as an area (hatched portion in FIG. 3) obtained by integration of an absorption wave within the range of 1000 $cm^{-1}$ to 1400 $cm^{-1}$ including a peak of 1080 $cm^{-1}$.

Figure 4:
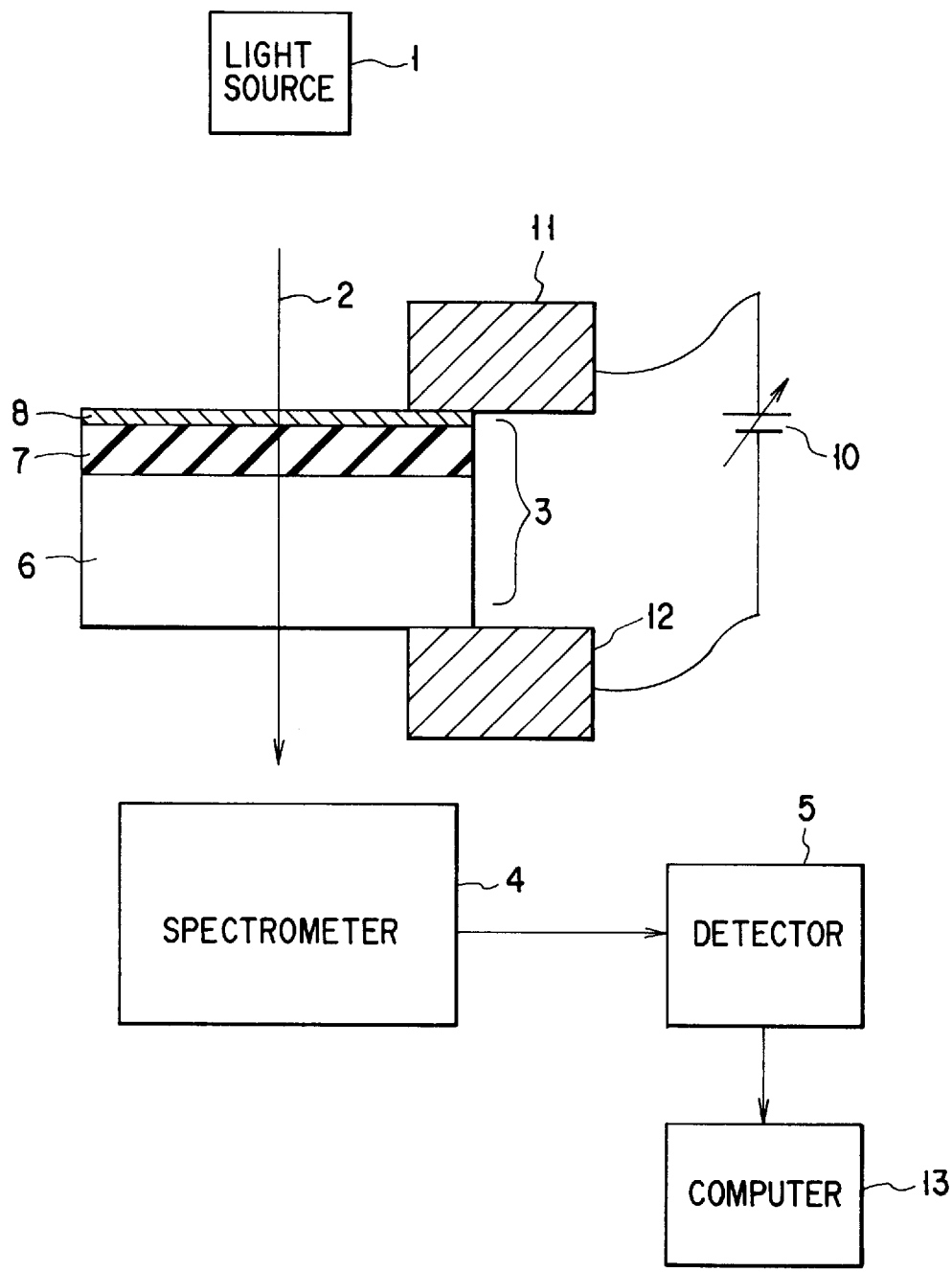
FIG. 4 is a diagram showing a potential difference measurement unit according to Embodiment 1 of the present invention, using the wavenumber shifted by the electric field of the absorbance peak of Si—O—Si antisymmetric stretching vibration of a SiO$_2$ film 7.

FIG. 4 shows a construction of a potential difference measurement unit based on the aforementioned relationship and using the phenomena that the absorbance peak of Si—O—Si antisymmetric stretching vibration of a $SiO_2$ film 7 is shifted in wavenumber by the electric field.

A positive electrode 11 and a negative electrode 12 are connected to a voltage generation source 10. A computer 13 calculates change in area of the absorbance peak of Si—O—Si antisymmetric stretching vibration, on the basis to the output data of the detector 5. The calculation results are substituted into the aforementioned equation to obtain the electric field E. Potential difference (between the upper surface and rear surface) of the $SiO_2$ film 7 is calculated from the thickness thereof.

This embodiment has been explained with respect to the case where the $SiO_2$ film is used. However, the present invention may be applied to a silicon nitride film, a silicon carbide film, aluminum oxide film, zirconium oxide film, cupric oxide film, tungsten oxide film, and the like. In particular, a dielectric film whose transmissivity relative to the light 2 (including infrared wave) is 1/20 or more is easy to measure.

Furthermore, the present invention employs a polycrystalline silicon film highly-doped with boron as an electrode. However, other conductive films may be used as long as they have no large absorption zone in the intrinsic absorption wavelength range to a dielectric film. In particular, an electrode whose transmissivity relative to the light 2 (including infrared wave) is 1/20 or more is easy to measure.

(Embodiment 2)

FIG. 5 is a schematic diagram of a helion wave excitation plasma CVD system equipped with an charge amount detection function, according to Embodiment 2 of the present invention.

This plasma CVD system comprises a CVD system main body for forming a dielectric film or the like and an charge amount measurement unit for detecting the amount of electric charge accumulated on the dielectric film or the like.

The CVD system main body mainly comprises a plasma generation chamber 21 for plasma generation, a reaction chamber 22 for film deposition reaction, a susceptor 23 for controlling a substrate temperature and serving as an electrode, a gas supply system 24 for supplying gas to a reaction chamber 22, and a gas evacuation system 25.

To the susceptor 23 for mounting a substrate 26 to be treated (hereinafter simply referred to as "treatment substrate") thereon, provided are a lamp heater 27 for heating the treatment substrate 26 and a cooling pipe 28 for circulating a coolant. The treatment substrate 26 can be maintained at a constant temperature by the lamp heater 27 and cooling pipe 28.

To the cooling pipe 28, a circulator 38 is provided. The circulator 38 circulates a coolant such as liquid nitrogen and cools the treatment substrate 26 rapidly. The lamp heater 27 used in combination with the cooling pipe 28 can change the substrate temperature in a pulse-like manner. Furthermore, to the susceptor 23, an electrode (not shown) is provided for electrostatically attracting the treatment substrate 26 to ensure heat conductivity between the treatment substrate 26 and a susceptor 23.

Furthermore, a gas supply pipe 30 is provided for supplying gas between the treatment substrate 26 and the susceptor 23. By the presence of gas introduced between the treatment substrate 26 and susceptor 23, the heat conductivity between treatment substrate 26 and susceptor 23 can be maintained.

To the susceptor 23, an electrode 31 for applying an RF voltage is provided. When the voltage is applied to the electrode 31 from an RF power source 39, the electric field between a plasma and the treatment substrate 26 changes, thereby controlling energy of ions injected into the treatment substrate 26. Between the susceptor 23 and the RF source 39, a matching box 53 is provided.

The gas supply system 24 comprises a gas supply pipe 32 and a gas supply ring 33. The gas supply pipe 32 is used for introducing gas into a plasma generation container 21. The gas supply ring 33 has a number of holes thereon for introducing the gas into the reaction chamber 22 uniformly.

Oxygen ($O_2$) serving as a plasma source is introduced into the gas supply pipe 32. A silane ($SiH_4$) gas is introduced into the gas supply ring 33. The amount of gas introduced is controlled by a valve which is opened or shut under the control of piezo element (not shown).

The piezo element is provided in the proximity of a gas inlet as close as possible. When the voltage applied to the piezo element per unit time is changed rapidly, the introduction of the gas is performed in a pulse-like manner.

The gas evacuation system 25 comprises a vacuum exhauster 40 and a conductance valve 41. The vacuum exhausting apparatus 40 maintains the interior portions of the reaction chamber 22 and the plasma generation container 21 at a vacuum of 0.1 m torr to 100 m torr. To the conductance valve 41, automatic open-close means is provided for changing the pressures of the chambers containers 21 and 22 with time.

In the portion engaged in plasma generation, a helicon wave excitation antenna 34 and a coil 35 for generating a magnetic field (arranged around the antenna 34) are provided. The helicon wave excitation antenna 34 is connected to an RF power source 37 via a matching box 36. In the RF power source, FM modulation, AM modulation, or pulse modulation can be made. The magnetic-field generation coil 35 is connected to the magnetic field power source 42 capable of FM modulation and AM modulation.

On the other hand, the electrification detector mainly comprises a laser source 43, a spectrometer 44, a laser detector 45, and a processing unit 46. The spectrometer emits a laser including wavelength of an infrared region. The spectrometer 44 and the laser detector 45 are constituents of an infrared spectrometer.

The electrification detector acts as follows. An dielectric film is electrically charged since a potential difference is present between a plasma and the susceptor 23. The electric field across the insulating film is obtained in accordance with the method described in Embodiment 1. The amount of electric charge accumulated on the dielectric film can be detected (calculated) from the electric field thus obtained.

The infrared light 49 emitted from the laser source 43 is introduced into the CVD system main body from the upper portion of the CVD system, with the aid of a mirror 47, passes through the treatment substrate 26, and withdrawn from the lower portion of the main body. An optical window on the infrared light transmitting passage, is formed of a material such as KBr suitable for transmitting light including a infrared wavelength.

The infrared light 49 transmitted through the treatment substrate 26 is turned in its course by a mirror 48 and enters the spectrometer 44, in which the infrared light 49 is dispersed. The absorbance at every wavelengths of the infrared light 49 by the treatment substrate 26 is measured by a laser detector 45.

The output signal from the laser detector 45 is transmitted to a processing unit 46 all the time. Control parameters of the RF power source 37, magnetic-field power source 42, MFC (Mass Flow Controller) 50, lamp heater power source 51, coolant circulator 38 are determined on the basis of change in the absorbance of an arbitrarily chosen wavelength per time. The determination results are transmitted to each of units through an A/D converter 52. In this way, feed back control is accomplished.

Hereinbelow, will be describe a method of forming a $SiO_2$ film by use of a helicon wave excitation plasma CVD system equipped with the charge amount detecting function, constructed as mentioned above.

In the first place, a current is supplied to the magnetic-field generation coil 35. The magnetic field of 100 G is generated on a coil center axis. The treatment substrate 26 (silicon substrate) is heated to 300° C. by controlling the lamp heater 27 and the circulator 38. A raw material gas, oxygen ($O_2$) is supplied into the plasma generation container 21 through the gas supply pipe 32 at a flow rate of 100 sccm. A silane gas, on the other hand, is introduced into the reaction chamber 22 through the gas supply ring 33 at a flow rate of 20 sccm. The resultant pressure is set to 5 m torr.

Next, 700 W of an RF power (13.56 MHz) from the RF power source 37 is applied to the helicon wave excitation antenna 34, thereby generating a plasma. As a result, a $SiO_2$ film is formed on the treatment substrate 26 at a deposition rate of 500 nm/min.

Figure 6:
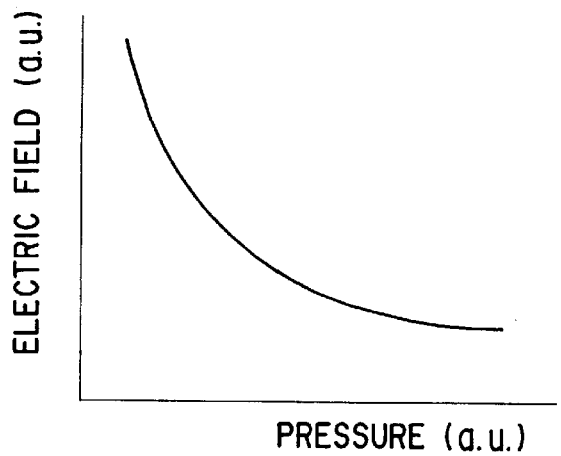
FIG. 6 is a characteristic diagram showing the relationship between the electric field of a SiO$_2$ film and pressure.

FIG. 6 is a characteristic diagram showing the relationship between the electric field across a $SiO_2$ film and pressure when a film formation pressure is changed, after the $SiO_2$ film (500 nm) is formed. The magnetic field across the $SiO_2$ film is obtained by the electrification detector. To describe more specifically, the electric field of the $SiO_2$ film is obtained by the processing unit 46 on the basis of the absorption of a Si—O—Si antisymmetric stretching vibration of a $SiO_2$ film obtained by the laser detector 45, in accordance with the method described in Embodiment 1.

After the $SiO_2$ film (500 nm thick) is formed, a plasma discharge is turned off, and then background absorbance is measured. Then, a plasma discharge is turned on, absorbance is measured. From values of absorbance thus-obtained, the absorbance used herein is calculated. From FIG. 6, it is found that the electric field across the $SiO_2$ film increases inversely proportional to the film-formation pressure. This phenomenon corresponds to the fact that the surface of the $SiO_2$ film is electrically charged.

From the measurement results by use of an electron cyclotron resonance (ESR) method, it was found that a number of unpaired electrons are present in the $SiO_2$ film when high pressure discharge is performed, in comparison with low-pressure discharge. The unpaired electrons of silicon present in a labile state in the $SiO_2$ film, increase the hygroscopicity of the $SiO_2$ film and decrease the insulation voltage thereof, degrading the reliability of the $SiO_2$ film.

The present inventors tried to reduce the charge amount of the $SiO_2$ film by pulsation of the RF power applied to the helicon wave excitation antenna 34. The relationship between the RF power and the electric field strength across the $SiO_2$ film is shown in FIG. 7.

Figure 7:
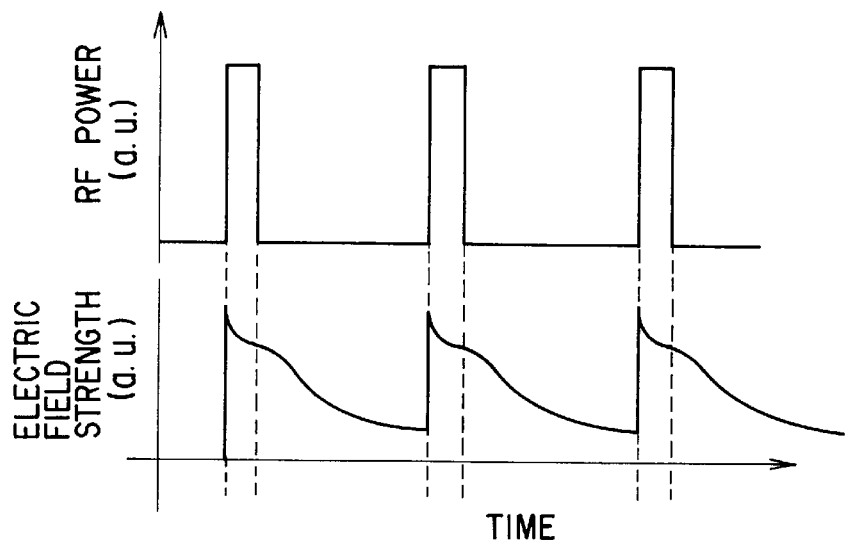
FIG. 7 is a diagram showing the relationship between an RF power and the strength of the electric field across a SiO$_2$ film.
Figure 8:
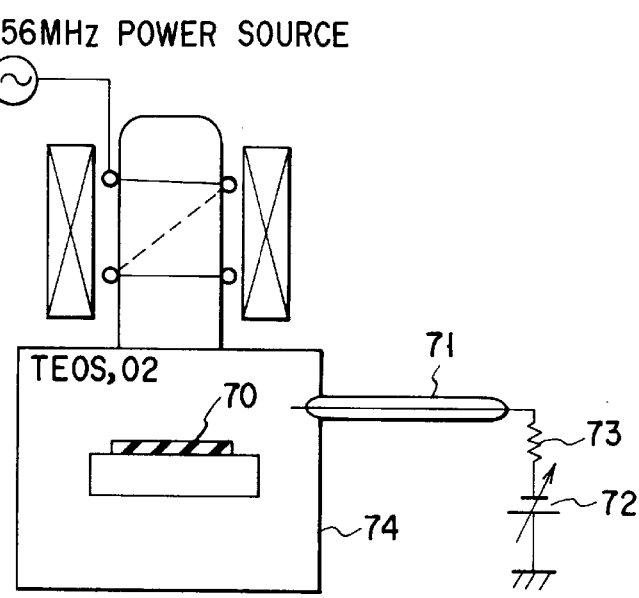
FIG. 8 is a schematic view of a measurement system for measuring change in current during film formation by use of a probe provided for measuring the cleanness of a vacuum chamber in a conventional plasma CVD system.

As is apparent from FIG. 7, at the moment the-RF power is applied, the $SiO_2$ film is charged. After the application of the RF power is terminated, the electric field strength (i.e. the charge amount) is reduced. Furthermore, as a period of the plasma discharge is shortened by increasing pulse interval, the total charge amount per time is lowered in average. However, the film formation rate significantly decreases.

Then, while the film-formation rate was being kept at 300 nm/min or more, feed-back control was made so as to be performed at the longest pulse intervals. As a result, it was found that the $SiO_2$ film is formed with a very small amount of unpaired electrons.

This embodiment relates to the helicon wave excitation plasma CVD system. The same measurement can be performed even if use is made of other plasma treatment systems such as a plasma CVD system, a plasma etching system, and a plasma sputter system. The method for plasma discharge is not limited to the helicon wave excitation type.

Although the case of the $SiO_2$ film has been explained in this embodiment, the present invention can be applied to other insulation films such as a silicon nitride film, a silicon carbide film, aluminum oxide film, zirconium oxide film, cupric oxide film and tungsten oxide film.

(Embodiment 3)

In this embodiment, we will explain an improvement of a probe method for monitoring the cleanness of a reaction chamber of the plasma CVD system or the like. The present inventors carried out experiments for measuring change in prove current during the film formation step by the plasma CVD system. A schematic diagram of the measurement system is shown in FIG. B.

A $SiO_2$ film 70 is formed under the conditions: tetraethoxysilane 10 sccm, oxygen 50 sccm, film-formation pressure 100 m torr, and RF application power 200 W, by use of a parallel plate plasma system. A probe 71 is provided to a vacuum chamber 74 serving as) the film formation chamber (plasma treatment chamber). To the probe 71, direct voltage (200V) is supplied from a power source 72.

Immediately after plasma is generated by use of TEOS (tetraethylorthosilicate)/$O_2$, ions are attracted into the probe 71 due to the potential difference between the plasma and the probe 71. Therefore, a negative current (ion current) flows as a probe current, a voltage (voltage signal) is generated across the resistance element 73.

Figure 9:
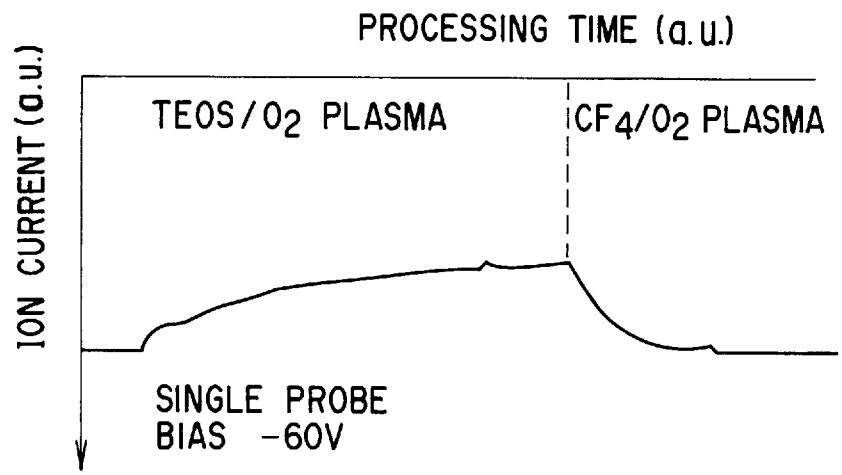
FIG. 9 is a diagram showing change in voltage signal of a probe with the passage of time measured by an x-y recorder in the plasma CVD system of FIG. 8.

FIG. 9 shows the results of change in the voltage with the passage of time, measured by an x-y recorder. In the figure, the ion current becomes larger toward the lower portion on the ordinate. Immediately after the film formation is initiated by use of the TEOS/$O_2$ plasma, the ion current (saturated ion current) shows a constant line. The ion current starts decreasing after 5 seconds have passed. This time-point coincides with the time when a polymer of $SiO_2$ or tetraethoxysilane is formed on a surface of the probe 71 and a flow-in current to the probe 71 is stopped.

Then, to clean a reaction product formed on the surface of the probe, a plasma discharge is performed under the condition: carbon tetrafluoride gas ($CF_4$) 30 sccm, oxygen ($O_2$) 20 sccm, and pressure 50 m torr. When the discharge for cleaning is initiated, ion current again increases and returns to the initial current level at the time point of 5 seconds after the initiation. This timing is coincident with the time when the surface of the probe 71 is cleaned by removing the reaction product from the surface of the probe 71 through etching.

From the aforementioned results, even if the amount of the reaction product formed on the surface of the probe 71 is very small, the prove current significantly decreases. It is therefore difficult to regard the probe current as an index indicating the cleanness of the interior of the vacuum chamber 74. To make the cleanness of the vacuum chamber 74 in correspondence with the probe signal, it is required to control the amount of the reaction product formed on the surface of the probe 71.

FIG. 10 is a schematic view of a contaminant measurement unit provided to the vacuum chamber 74 formed in consideration of the aforementioned circumstances. The distal end of the probe 71 is inserted in a hole structure of an insulation member 75, thereby electrically being isolated from the wall 74a of the vacuum chamber 74 by the presence of the insulation material. The distal end of the probe 71 is exposed in the interior of the vacuum chamber 74 through the hole structure.

In the plasma process, the deposition reaction is performed mainly by high energy charged particles such as ions and electrons. In this embodiment, the amount of the reaction species such as the charged particles reaching the surface of the probe 71 is suppressed by controlling the diameter of the opening portion and a depth of the hole structure, with the result that the reaction product is suppressed from being deposited on the surface of the probe 71.

The reaction product deposition rate on the surface of the probe can be suppressed if the diameter of the opening of the hole structure is set to a value equal to or more than the Debye length of the reaction species and the depth of the hole structure is set to a value equal to or more than a mean free path of the reaction species (charged particles) in the hole. As a result, the ion current in the vacuum chamber 74 will be measured within an acceptable cleanness range.

To be more specific, the opening diameter of the insulation member 75 is set to 5 mm and the depth to 30 mm. By these setting, the deposition of the reaction product on the probe 71 is suppressed. Therefore, the plasma ions can pass through the hole of the insulation member 75 and flow in the probe without being inhibited by the reaction product. As a result, the probe current can be measured in terms of the voltage drop generated in the resistance element 73, without fail.

Since the opening diameter and depth of the hole structure in the insulation material 75 are defined by the Debye length and the mean free path, respectively, they may be varied by influence of the gas pressure, gas flow rate, gas type, plasma generation power, and the like. To deal with this, it is effective to provide driving means for changing a position of the electrode to at least one of the electrode and the insulation material for changing an electrode position.

In this embodiment, the film-formation step and the cleaning step of the interior of the vacuum chamber 74 were repeated as follows, and the probe current was measured. In the film-formation step, a monosilane gas (10 sccm) and oxygen (100 sccm) are introduced into the vacuum chamber 74 and a pressure is set to 100 m torr, and then, an RF power is applied for 10 minutes. In the cleaning step, carbon tetrachloride (50 sccm) and oxygen (20 sccm) are introduced to set the pressure at 10 m torr, and then, the RF power is applied for 10 minutes. As a result, it was found that the probe current decreases after the film-formation is performed for 5 minutes, and that after the cleaning is performed for 2 minutes, the probe current increases. Therefore, it is ideal that 2-minute cleaning be performed every after 5 minute film-formation.

According to this embodiment, the probe current will not decrease until 5 minutes have passed in the film-formation. Therefore, the present invention is free from the problem that the probe current cannot be determined since the probe current significantly decreases before the contamination level in the interior of the vacuum chamber 74 reaches the cleaning-requiring level, or the problem that it is difficult to know when the cleaning should be started. In this case, therefore, the cleaning must be performed effectively for a short time.

If the cleaning technique of this embodiment is combined with the electrification measurement technique of Embodiment 2, plasma treatment can be performed with a good reproducibility compared to the conventional one. Furthermore, time required for the optimization of the process parameters, which has been performed depending upon empirical methods, can be shortened.

(Embodiment 4)

Figure 11:
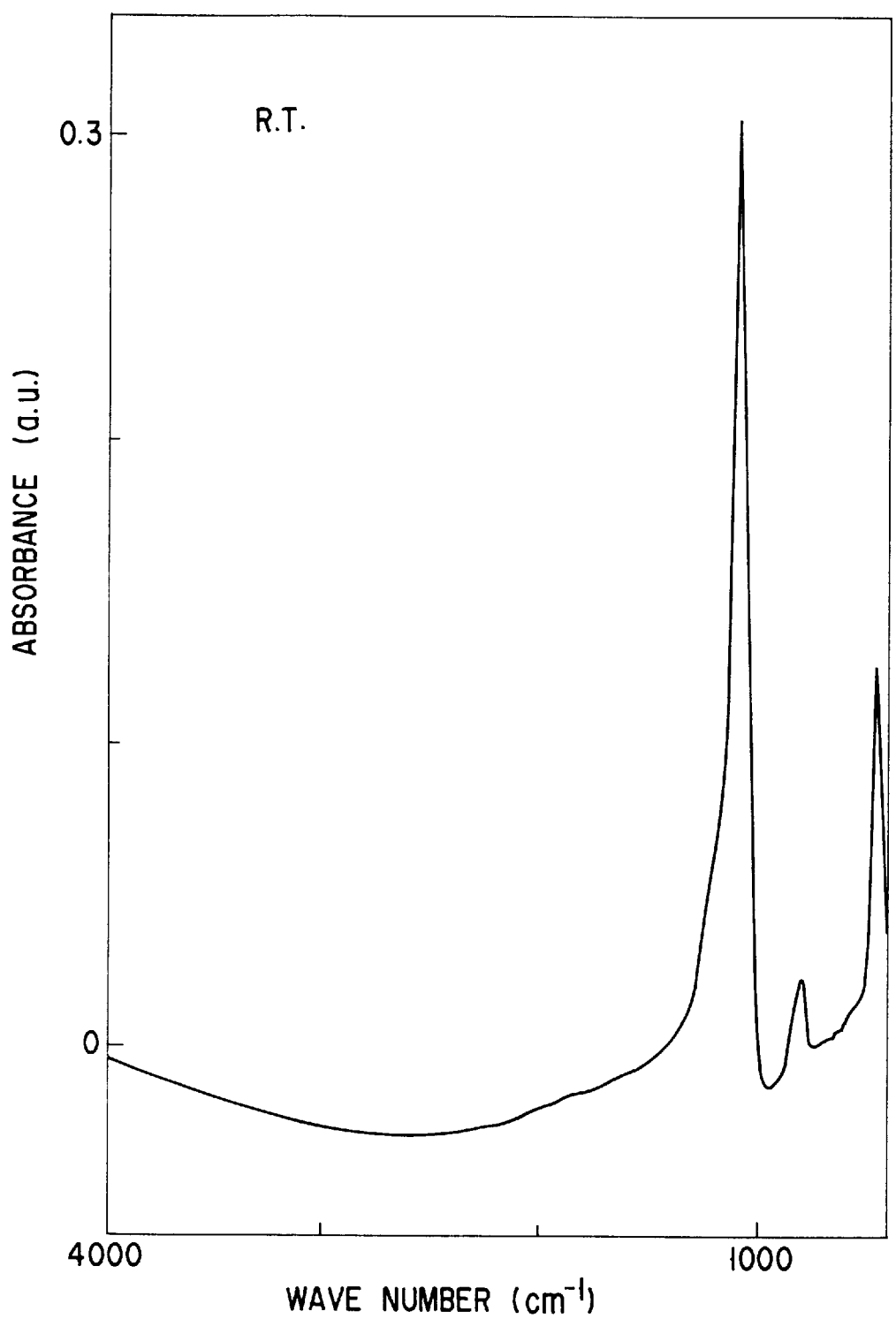
FIG. 11 is an infrared absorption spectrum of a SiO$_2$ film formed on a silicon substrate at room temperature.

FIG. 11 shows an infrared absorption spectrum of the $SiO_2$ film formed on a silicon substrate at room temperature.

An absorbance peak at a wavenumber of 1080 cm$^{-1}$ is due to Si—O—Si antisymmetric stretching vibration.

With respect to the infrared region including the absorbance peak at 1080 cm$^{-1}$ wavenumber, change in infrared absorption spectrum was checked at various temperatures to clarify the relationship among wavelength, absorbance, and substrate temperature. In addition, change in infrared absorption spectrum was checked with respect to a substrate different in film-thickness to clarify the relationship among wavelength, absorbance, and film thickness).

Figure 12:
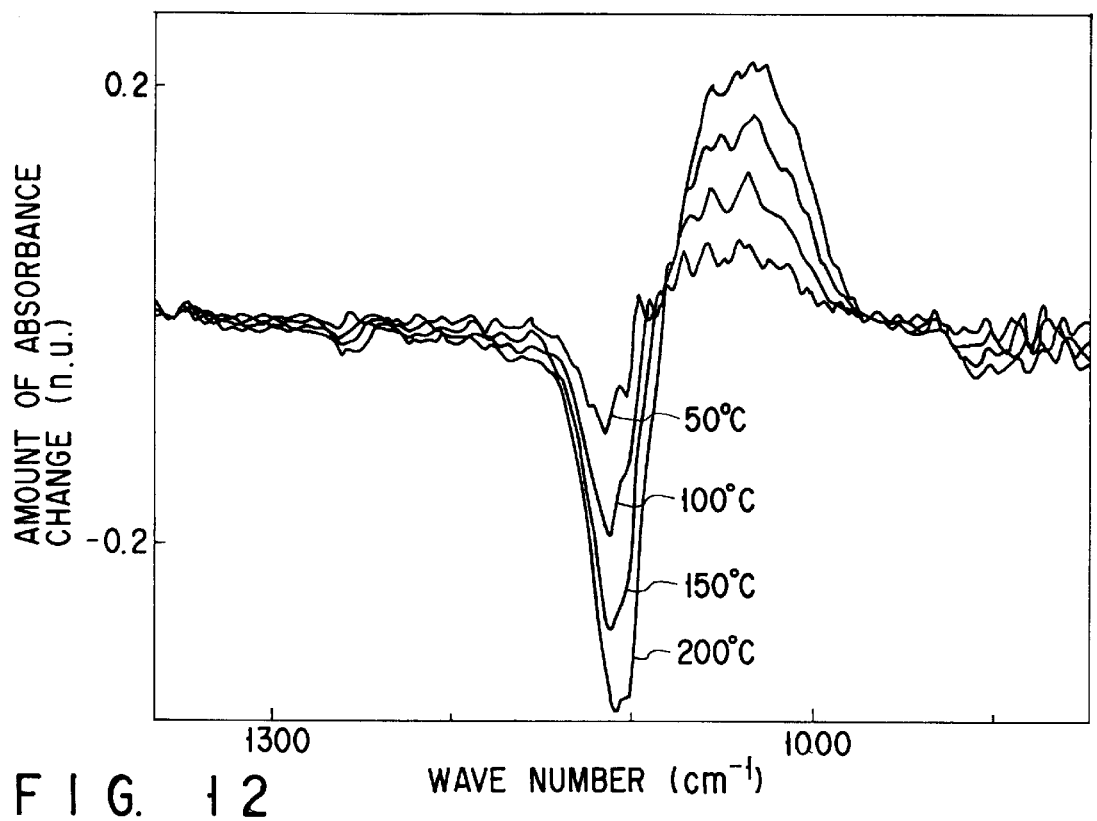
FIG. 12 is a diagram showing change in the infrared absorption spectrum of a SiO$_2$ film relative to temperature change.

FIG. 12 shows infrared absorption spectra obtained at different temperatures. The absorbance F (k) is plotted on the ordinate in FIG. 12 and is defined by the following equation:

$$F(k)=\log_{10}(f_T(k)/f_0(k))$$

where $f_T$ (k) is absorbance of the SiO$_2$ film at a wavenumber k and at a temperature T; $f_0$ (k) is an absorbance by the SiO$_2$ film at a wavenumber k and at room temperature.

As is apparent from FIG. 12, with temperature change, the wavenumber of the absorbance peak changes. As a result, at temperatures except for room temperature, downwardly projecting absorbance peaks are observed on the larger wavenumber side of a position of 1080 cm$^{-1}$ and upwardly projecting absorbance peaks are observed on the lower wavenumber side. Hence, if infrared absorption spectra at every temperatures are prepared as a data base (data on dependency of the infrared absorption spectrum upon temperature), can be obtained from the change in wavenumber of the absorbance peak.

Figure 13:
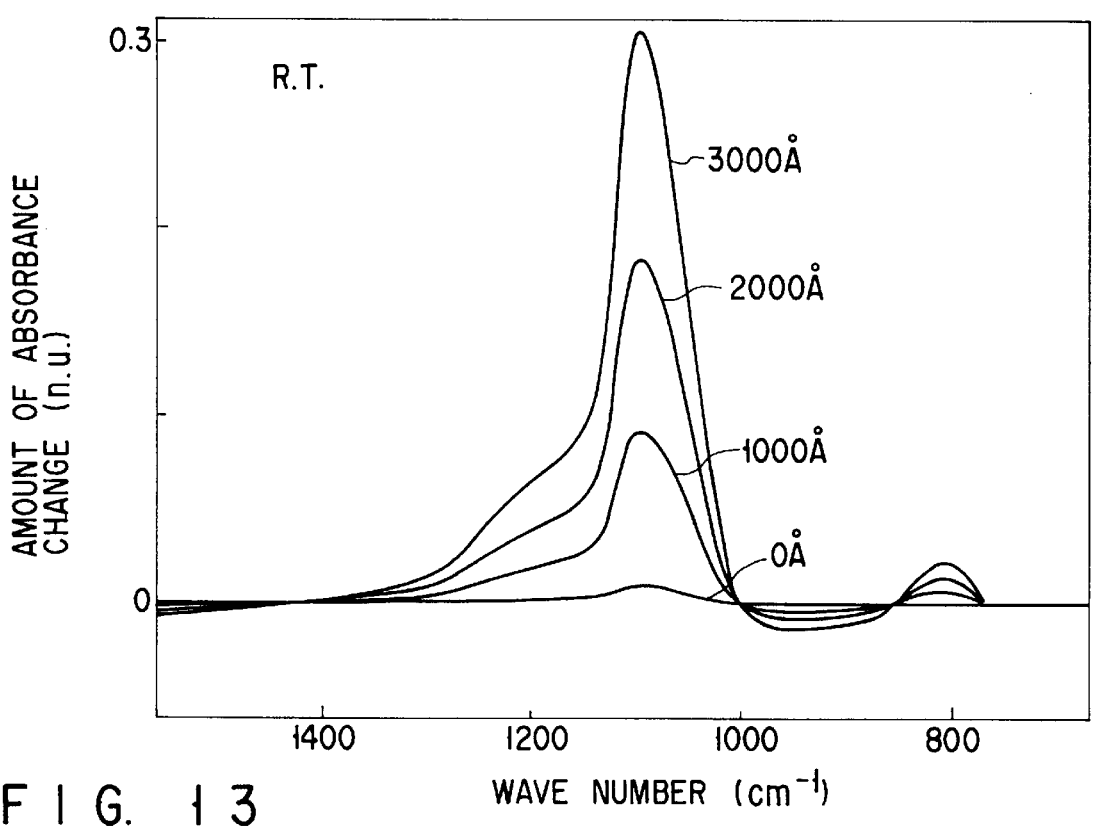
FIG. 13 a diagram showing change in the infrared absorption spectrum of a SiO$_2$ film at room temperature relative to film thickness change.

FIG. 13 shows infrared absorption spectra when a film thickness is variously changed. The absorbance F (k) plotted on the ordinate in FIG. 13 is defined in the same manner as in FIG. 12. Only difference from FIG. 12 resides in that absorbance (room temperature, at a wavelength k) of a silicon substrate itself without the SiO$_2$ film formed thereon, is shown as $f_0$ (k).

As is apparent from FIG. 13, the value of the absorbance peak increases as the film thickness increases. Hence, if infrared absorption spectra for every film thicknesses are prepared as a data base (data on the dependency of the absorption spectrum upon the film thickness), film thickness can be obtained from change in absorbance of the absorbance peak.

From the results mentioned above, if infrared spectra with respect to every temperatures and every film thicknesses are prepared, the temperature and film thickness can be easily obtained by computer calculation on the basis of change in the spectrum of the infrared region including an absorbance peak with the passage of time.

The aforementioned infrared absorption spectrum can be obtained by use of a single infrared spectrometer, so that the temperature and film thickness can be determined by the same spectrometer. The measurement system can be constructed with a simple structure.

(Embodiment 5)

FIG. 14 is a characteristic graph showing change in absorbance of the absorbance peaks at wavenumbers 1100 cm$^{-1}$ and 1030 cm$^{-1}$ relative to temperature change, obtained on the basis of the results in FIG. 12.

FIG. 15 is a characteristic graph showing change in absorbance of the absorbance peaks at wavenumbers 1100 cm$^{-1}$ and 1030 cm$^{-1}$ relative to film thickness change, obtained on the basis of the results in FIG. 13.

As the two wavenumbers sandwiching an absorbance peak of wavenumber 1080 cm$^{-1}$, wavenumbers 1100 cm$^{-1}$ and 1030 cm$^{-1}$ were coincidentally chosen in this embodiment. However, other two wavenumbers may be chosen. The reason why wavenumbers 1100 cm$^{-1}$ and 1030 cm$^{-1}$ were chosen is that change in absorbance at these wavenumbers is large and thus easily measured.

Hereinbelow, we will explain a measurement method of temperature and a film thickness by use of FIGS. 14 and 15. Assuming that change in the absorbance at a wavenumber of 1030 cm$^{-1}$ is 0.11, the change at a wavenumber of 1100 cm$^{-1}$ is −0.05, temperature and film thickness which satisfy both absorbance changes may be obtained. The temperature and film thickness can be obtained as follows.

In this case, change (0.11) in absorbance at a wavenumber 1030 cm$^{-1}$ is equivalent to a sum of the change from 0 to 0.1 in terms of absorbance (temperature change: 100° C.) in FIG. 14 and the change from 0.04 to 0.05 in terms of absorbance (film thickness change: 150 nm) in FIG. 15.

On the other hand, change (−0.05) in absorbance at a wavenumber 1100 cm$^{-1}$ is equivalent to a sum of the change from −0.1 to −0.2 in terms of absorbance (temperature change: 100° C.) in FIG. 14 and the change from 0.1 to 0.15 in terms of absorbance (film thickness change: 150 nm).

Therefore, the temperature and film thickness satisfying not only the change 0.11 in absorbance at wavenumber 1030 cm$^{-1}$ but also the change −0.05 at wavelength 1100 cm$^{-1}$, are 100° C. and 150 nm.

As described above, if the change amount in absorbance at each of wavenumbers is indicated by a symbol ΔA, ΔA is expressed by the sum of a change amount ΔA1 in absorbance when temperature changes and a change amount ΔA2 in absorbance when the film-thickness changes, there are a plurality of possible values ΔA1 and ΔA2 satisfying a equation ΔA=ΔA1+ΔA2. Among the plurality of values, the case where the temperature and film thickness corresponding to absorbance change in one wavenumber are equal to those corresponding to absorbance change in another wavenumber, is chosen. The temperature and film thickness thus selected, that is, the common temperature and film thickness in the above two wavenumbers are desired temperature and film thickness.

As shown in FIGS. 14 and 15, if an absorbance change between two wavenumbers with temperature change and an absorbance change between two wavenumbers with film thickness change, are prepared as discrete data bases, the temperature and film thickness can be obtained on the basis of a change in absorbance between two wavenumbers.

According to this embodiment, only required is to measure the absorbance levels at two wavenumbers. Different from Embodiment 4, it is not required to determine an infrared spectrum. Hence, the temperature and film thickness can be determined more easily.

Although two wavenumbers are used in this embodiment, wavenumbers more than three may be used.

(Embodiment 6)

Figure 16:
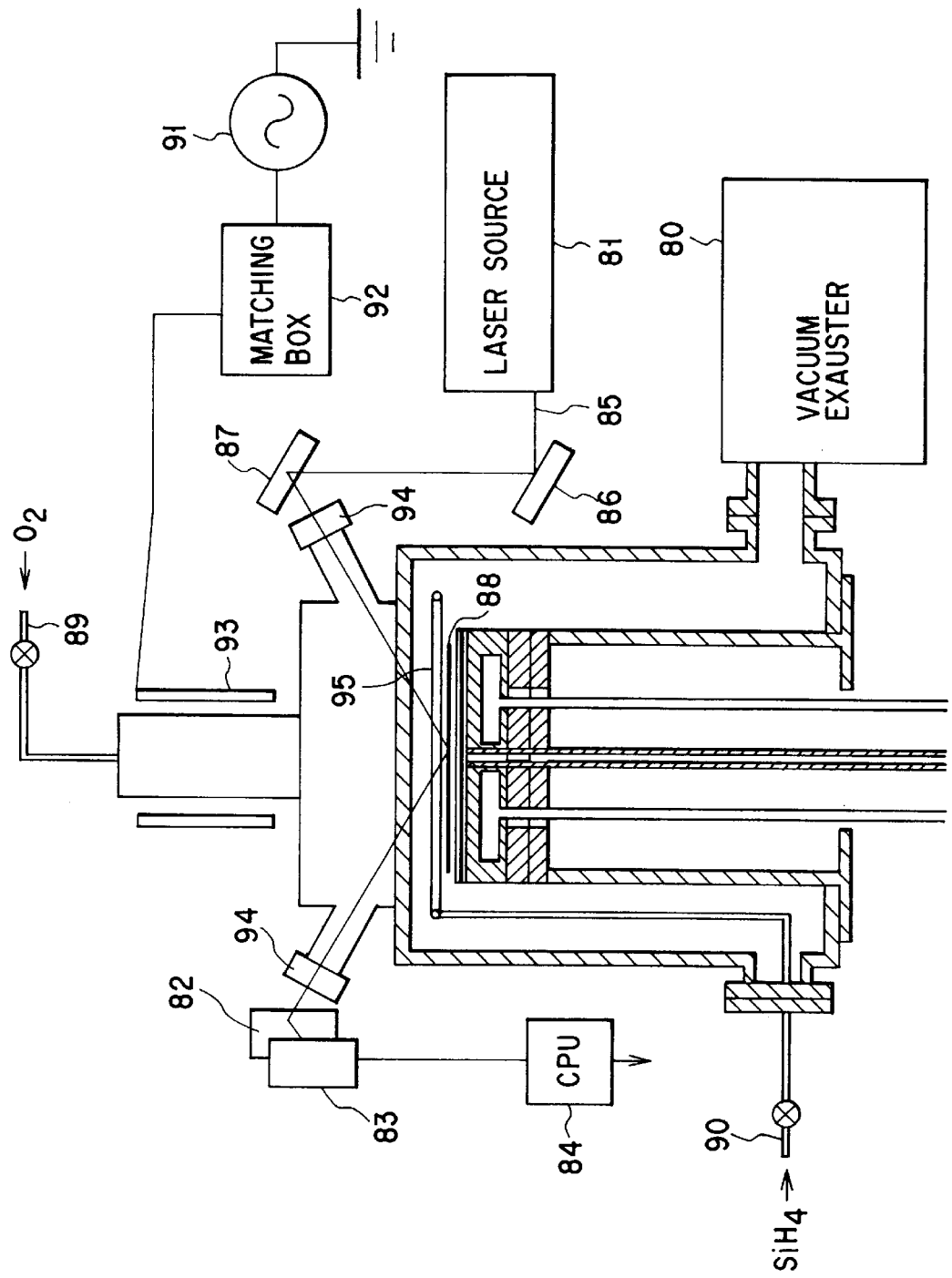
FIG. 16 is a schematic view of an inductive coupled plasma enhanced CVD system equipped with temperature/film-thickness measuring function according to Embodiment 6 of the present invention.

FIG. 16 is a schematic view of an inductive coupled plasma enhanced CVD system equipped with temperature/film-thickness measuring function, according to Embodiment 6 of the present invention. In this embodiment, an insulating film is formed. However, this system is applicable to a semiconductor film such as a polysilicon film.

The plasma CVD system mainly comprises a CVD system for forming a dielectric film and a temperature/film-thickness measurement unit for measuring temperature and film-thickness of the dielectric film.

As the CVD system main body, a generally used one may be employed. The temperature/film-thickness measurement unit mainly comprises a laser source 81 (for emitting laser including wavelength of the infrared region), a spectrometer 82 and a laser detector 83, and a processing unit 84.

An infrared light 85 emitted from the laser source 81 is introduced into the CVD system main body from an upper right side portion thereof with-the aid of mirrors 86 and 87, scattered by a treatment substrate 88, and then ejected out from the upper left side portion of the CVD system main body. An optical window 94 provided on the passage of the infrared light 85, is made of a material suitable for transmitting light (e.g. KBr) having a wavelength of the infrared region.

The infrared light 85 scattered by the treatment substrate 88 is dispersed by the spectrometer 82. The absorbance values of the infrared light 85 of wavenumbers 1100 $cm^{-1}$ and 1030 $cm^{-1}$ are measured by the laser detector 83.

In the system used herein, the infrared light 85 scattered by the treatment substrate 88 is measured. However, the system may be constructed suitable for measuring the infrared light 85 transmitted through the treatment substrate 88.

Signal output from the laser detector 83 is transmitted to the processing unit 84 all the time. In the processing unit 84, temperature and film-thickness are obtained on the basis of the aforementioned absorbance the previously-prepared data regarding the change in absorbance at wavenumbers of 1100 and 1030 $cm^{-1}$ relative to change in temperature and film thickness, as shown in FIGS. 14 and 15. The processing unit 84 controls a heater for heating the treatment substrate 88 and a circulator for cooling the treatment substrate in such a manner that the treatment substrate 88 has a predetermined temperature and film-thickness.

Hereinbelow, we will explain the method of forming a $SiO_2$ film by use of the inductive coupled plasma enhanced CVD system equipped with a temperature/film-thickness measurement function thus constituted.

In the first place, the treatment substrate 88 is set to 300° C. by controlling the heater and the circulator. Then, a raw material gas $O_2$ is supplied into a plasma generation chamber through a gas supply pipe 89 at a flow rate of 100 sccm. A $SiH_4$ gas is introduced as a silicon raw material gas into the plasma generation chamber through a gas supply ring 90 at a flow rate of 20 SCCM. The pressure of the chamber is set to 5 m torr by means of a vacuum evacuation unit 80. Finally, an RF power (700 W, 13.56 MHz) is applied from an RF power 91 to a plasma excitation antenna 93 by way of a matching box 92.

In the manner mentioned above, the $SiO_2$ film is formed on the surface of the treatment substrate 88 at a film-formation rate (deposition rate) of 500 nm/min. From the results of temperature and film-thickness measured at the film-formation time, it was confirmed that the temperature of a substrate surface increases as the film-formation proceeds, and that the film-formation rate gradually increases with an increase in the surface temperature. Furthermore, from the relationship among the composition of the $SiO_2$ film thus formed, the film-formation rate, and the substrate temperature, it was demonstrated that the composition of the $SiO_2$ film is deviated from the stoichiometric composition as the film-formation rate increases, and that the composition becomes closer to the stoichiometric composition as the substrate temperature increases.

To improve the productivity, it may be better to increase the film-formation rate, whereas, the $SiO_2$ film thus formed will have a composition deviated from the stoichiometic one. To proximate the composition of the $SiO_2$ film to the stoichiometic composition, it may be better to increase the substrate temperature, whereas, underlying layers such as an Al wiring and a diffusion layer present under the $SiO_2$ film will have adverse effects. Therefore, in consideration of the productivity, composition, and underlying layers, the film-formation rate and the substrate temperature must be set to desired values.

The film-formation rate can be controlled by, for example, application of the RF power to the plasma excitation antenna 93. The substrate temperature can be controlled by the heater and circulator. It is therefore preferable that a feed-back circuit for controlling the RF power, heater and circulator be provided to the system shown in FIG. 16 for setting the film-formation rate and the substrate temperature to predetermined values.

(Embodiment 7)

FIG. 17 is a schematic view of a horizontal dry cleaning equipment (hereinafter, simply referred to as "a dry cleaning equipment") equipped with the temperature measuring function, according to Embodiment 7 of the present invention.

The dry cleaning equipment mainly comprises a dry cleaning equipment main body for cleaning a silicon wafer and a temperature measurement unit for measuring the temperature of the silicon wafer.

The dry cleaning equipment is basically the same as a general horizontal dry cleaning equipment except that KBr windows 102 and 103 are provided to the horizontal reaction furnace 101. The dry cleaning equipment main body comprises a horizontal reaction furnace 101 formed of a quartz pipe at an end of which an inlet pipe 104 for introducing a non-oxidative gas and an HCl gas is provided, and the other end of which a cap 106 having an exhaustion pipe 105 is provided. Besides this, a heater 107 is provided around the horizontal reaction furnace 101.

In FIG. 17, reference numeral 108 indicates a quartz board on which a number of silicon wafers 109 are allowed to stand. The quartz board 108 is introduced into the horizontal reaction furnace 101 from the cap 106 side after the cap 106 is removed. The portion of the quartz board 108 for transmitting a laser beam 110 is formed of a thin film of 1 $\mu$m or less, as shown in FIG. 18.

On the other hand, the temperature measurement unit comprises a laser source 111 emitting a laser light 110 including infrared wavelengths, a reflection mirror 112 provided to the upper portion of the KBr window 102, a reflection mirror 113 provided to the lower portion of the KBr window 103, a laser detector 115 with a filter 114 provided on the entire surface of the face for receiving the incident laser 110, and a processing unit 116. The filter 114 allows the incident laser having wavenumbers 1100 $cm^{-1}$ and 1030 $cm^{-1}$ to selectively transmit therethrough. In stead of the filter 114 selecting the aforementioned wavenumbers, other filters corresponding to desired wavenumbers may be used.

The laser light 110 emitted from the laser source 111 is turned in proceeding course by a reflection mirror 112 and introduced into the horizontal reaction furnace 101 via the KBr window 102. Part of the laser light 110 introduced into the furnace 101 transmits through the thin film (1 $\mu$m or less) and enters the reflection mirror 113 via the KBr window 103. Of the reflection light components, a light component with a wavenumber of 1100 or 1030 $cm^{-1}$ is detected by a laser detector 115. The amount of infrared light (wavenumber of 1100 or 1030 $cm^{-1}$) absorbed by the quartz board 108 is determined in this manner.

The output signal from the laser detector 115 is transmitted to a processing unit 116 all the time. The processing unit 116 plays a role in obtaining temperature of the quartz board 108 on the basis of the infrared light absorbance mentioned above and the previously-obtained data base regarding change in absorbance at wavenumbers 1100 $cm^{-1}$ and 1030 cm$^{-1}$ relative to temperature change, in the same manner as in Embodiment 4. Based on the temperature thus obtained, the heater 107 is controlled in a feed-back style to heat the silicon wafer 109 to a desired temperature.

Using the dry cleaning equipment thus constructed, a silicon substrate covered with a thick thermal oxidation film compulsively contaminated with Fe, is cleaned by thermal treatment for one hour in an N$_2$ ambient containing 10% HCl. In this case, the temperature of the quartz board 108 is controlled in a feed-back style to set 550° C. by the heater 107, as mentioned above.

The silicon wafer 109 thus cleaned was checked. It was found that Fe is gettered efficiently. No defects such as pits were observed in the silicon wafer 109.

A modified dry cleaning equipment of this embodiment is shown in FIGS. 19A, 19B and 20. FIGS. 19A and 20 correspond to FIGS. 17 and 18. The processing unit 116 is omitted. FIG. 19B is a view of the dry cleaning equipment of FIG. 19A seeing from the cap 106 side. Like reference numerals are used to designate like structural elements corresponding to the dry cleaning equipment of FIGS. 17 and 18 and further explanation is omitted for brevity's sake.

The construct of the modified dry cleaning equipment is used not for detecting the transmission light but for detecting the reflection light. The modified cleaning equipment differs from that of FIG. 17 in the following respects: First, the KBr window 103 is provided on the upper wall of the horizontal reaction furnace 101 in the same fashion as the KBr window 102. Second, a reflection board 117 for reflecting the laser light 110 made of a metal such as Al is embedded in the quartz board 108 having a mirror-like surface. Third, the reflection board 117 is covered with a protecting insulation film 118 such as a silicon oxide film, and the laser detector 115 is provided above an upper portion of the horizontal reaction furnace 101 in the same way as the laser source 111.

(Embodiment 8)

Figure 21:
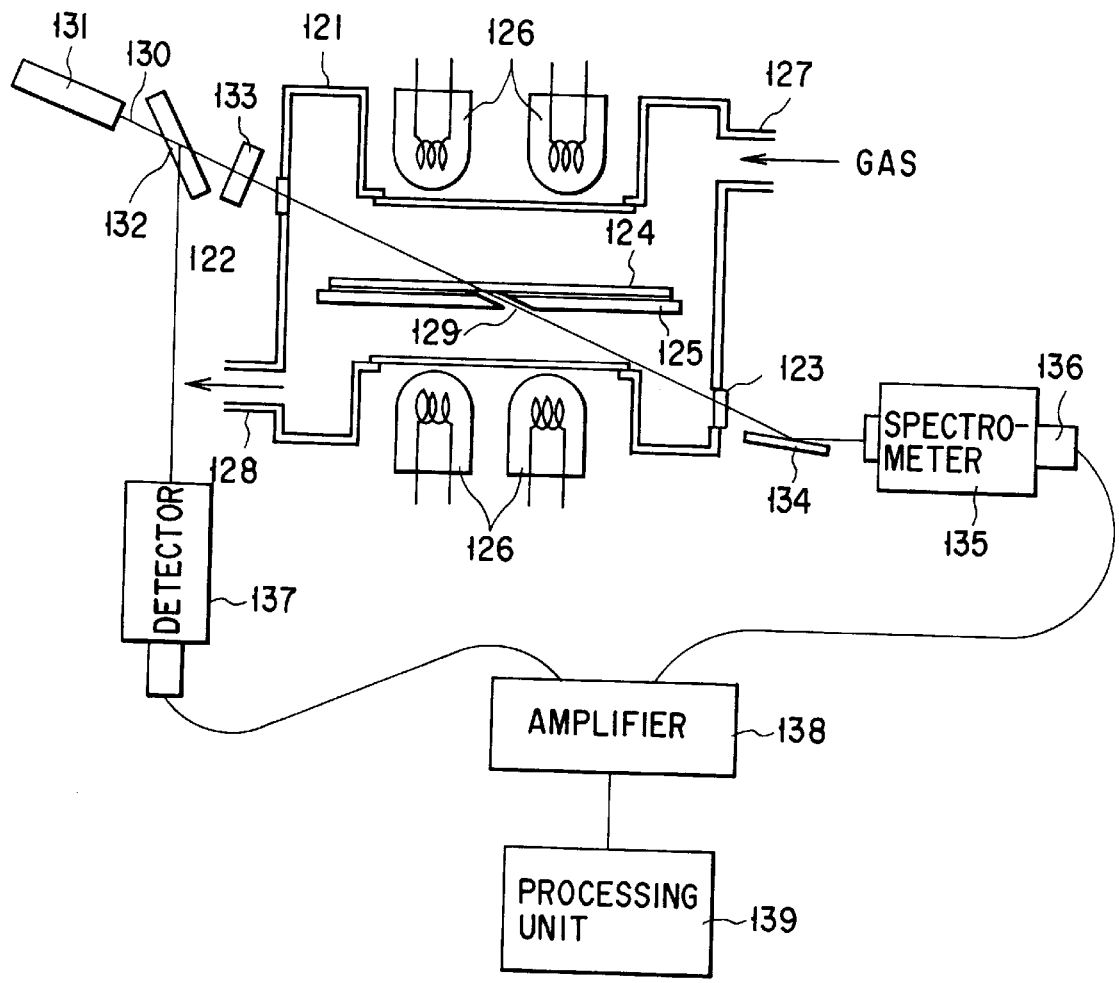
FIG. 21 is a schematic diagram of a high-speed temperature raising equipment equipped with a temperature measurement function according to Embodiment 8 of the present invention.

FIG. 21 is a schematic diagram of a single-processing high-speed temperature raising equipment (hereinafter, simply referred to as "high-speed temperature raising equipment") equipped with a temperature measurement function according to Embodiment 8 of the present invention.

The high-speed temperature raising equipment mainly comprises a high-speed temperature raising equipment main body for raising temperature of a silicon wafer (treatment substrate) at a high speed and a temperature measurement unit for measuring the temperature of the silicon wafer.

The high-speed temperature raising equipment main body is the basically the same as a general temperature raising equipment except that CaF$_2$ windows 122 and 123 are provided to a vacuum chamber 121. To be more specific, the main body comprises the vacuum chamber 121 for heating a silicon wafer 124 accommodated therein, at a high speed, a wafer holding mechanism 125 for holding the silicon wafer 124, provided in the vacuum chamber 121, and a lamp heater 126 for heating and raising temperature of the silicon wafer 124 from 100° to 1300° C. for a short time.

The process gas is introduced into the vacuum chamber 121 from a gas inlet 127 provided on the upper inner wall thereof and evacuated from the evacuation outlet 128 provided on the lower inner wall of the vacuum chamber 121. The treatment in the vacuum chamber can be carried under an atmospheric ambient or a reducing ambient by controlling the evacuation amount by an evacuation system (not shown). In the wafer holding mechanism 125, a hole 129 is formed for passing a laser light there through.

On the other hand, the temperature measurement unit comprises units 131 to 139. A semiconductor laser source 131 is capable of varying the wavelength and emits laser light 130 including infrared wavelength. A beam-splitter 132 splits the laser light 130 into two light components. A polarizer 133 converting one of the split laser light 130 to polarized light p. A refection mirror 134 turns a light path of the laser light 130 passed through the vacuum chamber 121. A dispersion spectrometer 135 disperses the course-converted laser light 130. A detector 136 detects the dispersed laser light 130. An auxiliary detector 137 detects the intensity of the other split laser light 130 in the above. An amplifier 138 amplifies output signal(reference signal) from the detector 137 and amplifies output signal from the detector 136. A processing unit 139 determines the temperature of a silicon wafer 124 on the basis of output signal (wavenumbers and absorbance at the wavenumbers) from the amplifier 138 and previously-prepared data regarding change in absorbance of absorbance peak relative to temperature change.

Examples of the semiconductor laser source 131 include Ti:Al$_2$O$_3$ laser source, a color laser source using a YAG laser as an excitation light. The semiconductor laser source 131 is provided in such a manner that the laser light 130 is allowed to enter the silicon wafer 124 through the CaF$_2$ window 122 with a Brewster angle. In this manner, absorption efficiency of the laser light 130 by the silicon wafer 124 can be improved.

The laser light 130 directed to the silicon wafer 124 passes through the hole 129 in the wafer holding mechanism 125 and a CaF$_2$ window 123, reflects at the refection mirror 134, and enters the dispersion spectrometer 132. Hence, the laser light 130 can be dispersed at the position remote from the lamp heater 126 and thereby avoiding the major influence from radiant light of the lamp heater 126. Consequently, the laser light exclusively within the wavelength zone of the laser light 130 can be introduced into the main detector 136. As the detector 136, use may be made of an MCT detector (mercury cadmium telluride photo-detector) detectable light within broad wavelength region.

Temperature control at the time of high-speed temperature raising is performed as follow. In the first place, a bias voltage of the semiconductor laser source 131 is changed, thereby extending frequency of the laser light 130, i.e., wavenumber range of infrared light from 1070 cm$^{-1}$ to 1140 cm$^{-1}$. Simultaneously, the absorbance is determined by the main detector 136 at 0.1 cm$^{-1}$ intervals.

The output signal from the main detector 136 is transmitted to the processing unit 137 via the amplifier 138. In this case, the amplifier 138 corrects the output signal from the detector 136 on the basis of the change in the output signal (reference signal) from the auxiliary detector 137, with the result that the corrected output signal is transmitted to the processing unit 139.

Alternatively, the reference signal may be transmitted from the amplifier 138 to the processing unit 139, in which the output signal may be corrected.

As reference data, the absorbance of a silicon wafer (FZ crystal) is measured in the same manner as above, separately from the silicon wafer 124. Using the reference data and a difference spectrum method, influence by absorption due to lattice vibration of silicon atoms and influence by light from a radiant component are eliminated from the output signal from the detector 136.

Since deconvolution is performed by means of a maximum entropy method in the processing unit 139, the position of absorbance peak wavenumber is obtained all the time. Furthermore, the temperature of the silicon wafer 124 is obtained by the processing unit 139, on the basis of the above-obtained absorbance peak and the previously-prepared data regarding change in absorbance peak relative to temperature change. Based on the temperature thus obtained, the temperature of the silicon wafer 124 is adjusted to a predetermined value by feed-back control of the lamp heater 126.

The temperature distribution of the surface of the silicon wafer 124 is obtained by taking at least two measuring points. Based on the results, output from the lamp heater 126 is controlled in a feed-back style. In this way, temperature of the silicon wafer 124 can be raised more quickly and temperature distribution of the surface thereof can be improved more effectively.

In this embodiment, temperature was calculated from the amount of change in absorbance peak of the light within the wavenumber range from 1070 cm$^{-1}$ to 1140 cm$^{-1}$. However, the wavenumber range usable in the temperature calculation, is not limited to the aforementioned range.

The peak position may be obtained by measuring the absorbance of infrared light in the wavenumber range of 1680 cm$^{-1}$ to 1760 cm$^{-1}$ at 0.1 cm$^{-1}$ intervals, and then effecting deconvolution by a Wiener filter method.

Particularly, this wavenumber range does not include absorption by silicon atoms. Therefore, it is not necessary to perform a step of eliminating the influence of the lattice vibration by the silicon atoms in accordance with the difference spectrum method using another silicon wafer (FZ crystal).

The temperature may be calculated by obtaining absorbance peak in accordance with another method. In this method, the absorbance peak is obtained by measuring the infrared absorption within the wavenumber range from 505 cm$^{-1}$ to 525 cm$^{-1}$ at a 0.02 cm$^{-1}$ intervals and performing deconvolution by a Gaussdizaul method.

(Embodiment 9)

Hereinbelow, Embodiment 9 of the present invention will be explained. In this embodiment, a high-speed temperature raising unit is used in the same manner as in Embodiment 8.

In this embodiment, absorbance is not obtained by using the continuous wavenumber range as is the case of Embodiment 7. The absorbance is obtained with respect to each of discrete points 500 cm$^{-1}$, 600 cm$^{-1}$, 700 cm$^{-1}$, 800 cm$^{-1}$, 900 cm$^{-1}$, 1000 cm$^{-1}$, 1200 cm$^{-1}$, 1500 cm$^{-1}$, and 2000 cm$^{-1}$. The absorbance data are plotted and a curve "C×$\lambda^2$" is determined by the least squares method. From the curve, value of C is obtained. In the equation C×$\lambda^2$, $\lambda$ is a wavelength of a laser. C is a coefficient. The temperature of the wafer can be obtained by the processing unit 137 on the basis of the relationship between the coefficient(C) and the temperature of the silicon wafer 124.

In this embodiment, output of the lamp heater is feed-back controlled in such a manner that the temperature of the wafer becomes constant. By virtue of the feed-back control, the temperature of the silicon wafer 124 can be increased more quickly and the temperature distribution over the surface can be improved, in the same manner as in Embodiment 7.

The embodiments 8 and 9 may be modified in various ways as follows:

The light source is not limited to a semiconductor laser source. Any light source may be used if it is an intensive light source. In stead of using a laser source capable of changing wavelength, a plurality of laser sources having different wavelengths can be interchangeably used. In this case, more intensive laser light can be obtained.

As the laser source, instead of a single-mode laser source (Ti:Al$_2$O$_3$ laser source, a color laser source using a YAG laser as an excitation light) emitting light of a single-wavelength at one time, a multi-mode laser source emitting light having a wide variety of wavelengths, may be used. When the multi-mode laser source is used, light of a desired wavelength is selected from the wide variety of wavelengths by a spectrometer.

The detector is not limited to an MCT detector. Any detector may be used as long as it can capture light having a wavenumber in the measurable range. For example, use may be made of a CCD camera with an optical filter and a semiconductor detector made of InSb, PbGeTe, or PbSnTe.

As a method of suppressing influence by fluctuation of laser light, the following method may be used. If two laser beams split by a beam splitter is separately and alternately introduced into a detector by use of a mechanical chopper, it is possible to eliminate the inherent difference laying between two detectors.

In Embodiments 8 and 9, the measurement is performed by use of light absorption by a carrier and high resolution of light is not required. Hence, light may be directed to the silicon wafer with an incident angle other than the Brewstar angle.

The laser transmitted through the silicon wafer is measured in Embodiments 8 and 9, however, construction may be made in such a way that the laser reflected by the silicon wafer can be measured.

(Embodiment 10)

Figure 22A:
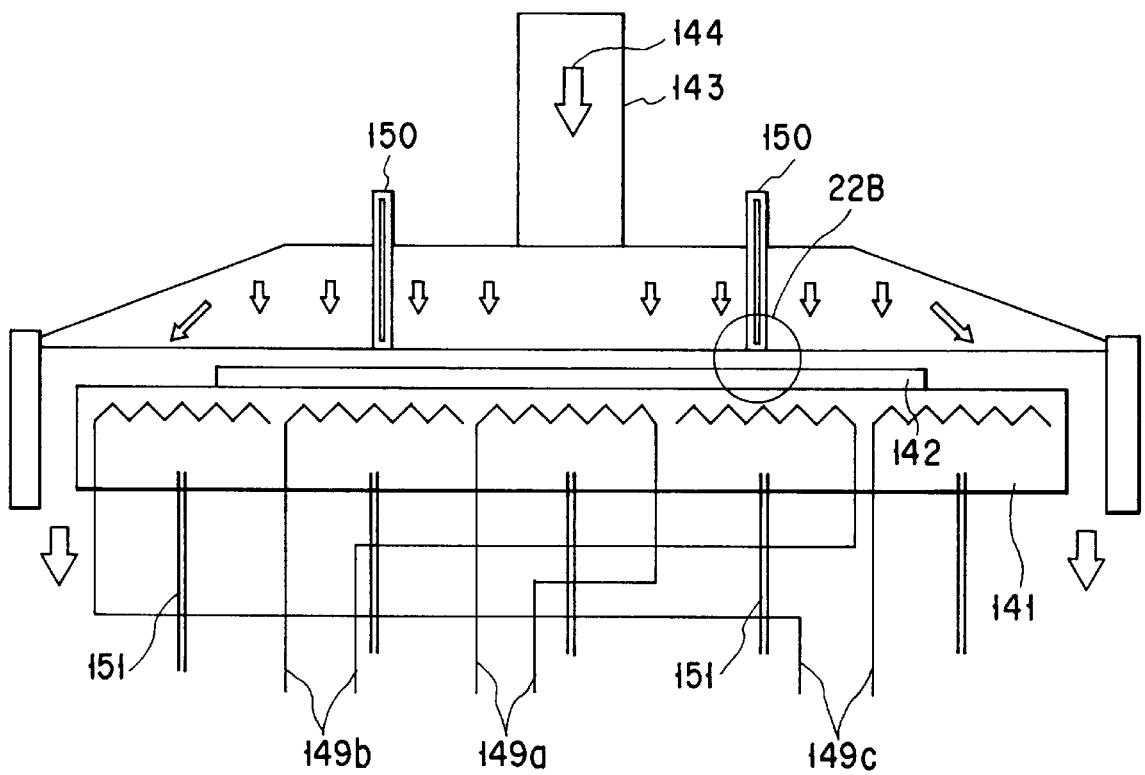
FIG. 22A is a schematic view of a heating unit equipped with a temperature measurement function, for use in PEB treatment of a resist, according to Embodiment 10 of the present invention.
Figure 22B:
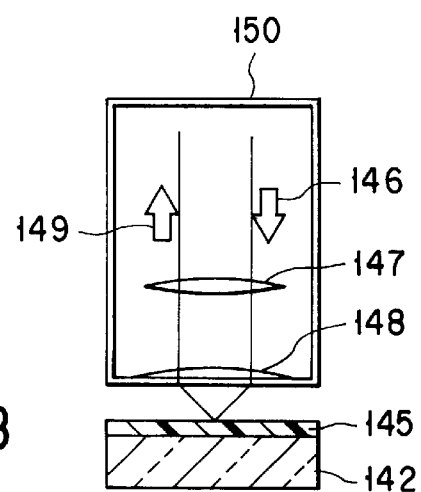
FIG. 22B is an enlarged view of a portion designated by 22B of FIG. 22A.

FIGS. 22A and 22B are schematic views showing a structure of a heating unit equipped with a temperature measurement function for use in the PEB treatment for a resist, according to Embodiment 10 of the present invention. In this embodiment, a resist pattern is manufactured by electron-beam exposure.

In the first place, a chemical sensitization series resist is coated on a mask substrate in a thickness of 0.5 $\mu$m. The resultant construct is baked on a hot plate at 90° C. for 10 minutes. The mask substrate used herein consists of a quartz substrate and a laminate film consisting of a chrome containing film and a chrome oxide containing film. The size of the mask substrate is 6 inch square and 0.25 inch thick.

Subsequently, using an electron beam exposure apparatus, a variable shaped beam is exposed to the mask substrate at a acceleration voltage of 50 keV and in a dose of 12 $\mu$C/cm$^2$. A exposure pattern used herein is a line and space pattern of 0.5 $\mu$m. Such a line and space pattern is drawn over the exposed entire surface (135 mm×135 mm) by the electron beam exposure apparatus.

Then, the mask substrate 142 is mounted on the hot plate 141 of the heating unit shown in FIG. 22A. The PEB treatment is applied to the mask substrate to perform the acid catalyst reaction of the chemical sensitization resist. During the reaction, air 144 previously heated to 90° C., is supplied to the mask substrate 142 from a fan 143 provided above the hot plate 141.

As shown in FIG. 22B, an infrared light 146 from a detector 150 is directed onto a resist 145 on the mask substrate 142 through lenses 147 and 148. The reflection light 149 from the resist is detected by the detector 150. As a result, an absorbance peak intrinsic to a t-butyl group can be detected since the side chain thereof is reduced by being removed with an acid catalyst. Based on the absorbance peak thus obtained and the previously-prepared data base with respect to change in absorbance peak relative to temperature change, the change in temperature distribution over the surface is measured with the passage of time. The absorbance is measured with respect to 25 sites in the surface.

Based on the distribution of the absorbance peaks over the surface, power to be applied to each of three-divided heater blocks 149a to 149c is controlled. The application power to the center heater block 149a is controlled in such a way that the temperature thereof is set to be 90° C. on the basis of the temperature measured by use of thermocouple 151. The application power to the other two heater blocks 149b and 149c is controlled in a feed-back style so as to obtain a uniform distribution of absorbance peaks over the hot plate 141 on the basis of temperature measured by the thermocouple 151.

The control profile of the heater blocks 149a to 149c is monitored starting from 45 seconds before the mask substrate 142 is mounted on the hot plate 141. The detailed conditions for reproducing the same treatment are recorded per second.

The mask substrate 142 is then immediately transferred from the hot plate 141 to a cleaning plate placed in the cooling unit. The cleaning plate has a circulator for circulating a cooling water, and thereby the mask substrate 142 can be maintained at low temperature.

The mask substrate 142 is separated from the cleaning plate with a plastic plate of 0.3 mm thick interposed therebetween. Air previously cooled to the same temperature as that of the cleaning plate is blown onto the mask substrate 142 and evacuated from the side of the cooling unit. The mask substrate is cooled in this manner for 5 minutes.

After completion of the 5-minute cooling, the mask substrate 142 is allowed to stand alone at room temperature for 5 minutes and then subjected to development with an alkaline development solution by means of a spray method. The development is carried out at a temperature of 23° C. for 75 seconds. After the development, the mask substrate is rinsed with pure water for 3 minutes by means of the spray method in the same manner as in the development step.

The mask substrate is dried while being rotated. In this manner, a resist pattern is accomplished.

The dimensions of the resist pattern thus formed were measured by critical dimension measurement SEM. As a result, various data of 14×14 sites in 132 mm square were obtained. The variance in dimensions was reduced to 22.5 nm in terms of a standard deviation 3σ.

In contrast, a resist pattern formed by a conventional method while temperature of the mask substrate was being controlled by a thermocouple inserted in a hot plate, variance was 50.2 nm in terms of standard deviation 3σ. In addition, no concentric form distribution of variance was observed over the surface. Therefore, it is considered that variance is due to an electric beam exposure apparatus.

Of a number of masks for use in practical DRAM products, nine mask substrates for critical layers, which are particularly difficult in mask alignment, were manufactured under the same conditions reproducible the treatment employed in this embodiment. Each mask substrate was formed at an interval of at least 5 minutes.

The dimensions of the nine mask substrates thus obtained were measured with respect to 60 sites for each corresponding to a DRAM memory cell. One mask substrate had a variance of 28.7 nm in terms of standard deviation 3σ. Other eight mask substrates had a variance of less than 25.0 nm in terms of standard deviation 3σ.

These values are significantly small compared to 50 nm (3σ) obtained by conventional technique. It was thus confirmed that the variance in dimensions can be sufficiently lowered. The variance of the present invention is almost the same as those having been attained independently of temperature in a very small region by a conventional method. The variance extending over the entire surface was reduced to ⅓ times of the variance taking place in a conventional method.

The present invention is not limited to embodiments mentioned above. In the embodiments, a plasma CVD system is explained as the plasma treatment system. However, the present invention can be applied to other plasma treatment systems such as a plasma etching system and plasma sputtering system. Although, an silicon oxide film is used in the embodiments above, other insulation films such as silicon nitride film may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A measurement system comprising:

holding means for holding a dielectric film formed on at least a semiconductive substrate and sandwiched between the substrate and a conductive film;

voltage application means for applying voltage between the substrate and the conductive film;

variable voltage source for supplying the voltage to the voltage application means;

light radiation means for irradiating the dielectric film with light including wavelength of an infrared region and transmitting the light through the dielectric film;

light absorbance detection means receiving the light transmitted through the dielectric film, for detecting absorbance of an absorbed light component in an absorption wavelength region intrinsic to the dielectric film; and potential difference measurement means for measuring a potential difference between the substrate and the conductive film of the dielectric film on the basis of change in absorbance of the light component when the voltage is changed by the variable voltage source.

2. The measurement system according to claim 1, wherein the holding means holds a dielectric film containing one element selected from the group consisting of silicon dioxide, silicon nitride, silicon carbide, aluminum oxide, zirconium oxide, cupric oxide and tungsten oxide.

3. The measurement system according to claim 1, wherein the conductive film has a transmittance to the light within absorption wavelength region intrinsic to the dielectric film which is ¹/₂₀ or more of transmittance to the light including the absorption wavelength region.

4. A measurement method comprising the steps of:

applying voltage to a dielectric film sandwiched between at least a semiconductive substrate and a conductive film;

irradiating the dielectric film with light including wavelength of an infrared region and transmitting the light therethrough;

receiving the light transmitted through the dielectric film and measuring absorbance of the light; and measuring a potential difference between the substrate and the conductive film of the dielectric film on the basis of change in absorbance of the light within an absorption wavelength range intrinsic to the dielectric film when the voltage is changed.

5. The measurement method according to claim 4, wherein the step for applying voltage includes a step of applying the voltage to a dielectric film containing one element selected from the group consisting of silicon dioxide, silicon nitride, silicon carbide, aluminum oxide, zirconium oxide, cupric oxide and tungsten oxide.

6. The measurement method according to claim 4, wherein the step of applying the voltage employs a conductive film having a transmittance to the light within absorption wavelength region intrinsic to the dielectric film which is 1/20 or more of transmittance to the light including the absorption wavelength range.

7. A measurement system comprising:
plasma treatment means for applying a predetermined plasma treatment to a dielectric film on a substrate by use of plasma, the plasma treatment means having an electrode serving as a susceptor on which the substrate is to be mounted;
light radiation means for irradiating the dielectric film with light including wavelength of an infrared region and transmitting the light through the dielectric film;
light absorbance detection means for detecting absorbance of light within an absorption wavelength region intrinsic to the dielectric film, among the light absorbed by the dielectric film; and
potential difference measurement means for measuring a potential difference of the dielectric film charged with the plasma, on the basis of a difference in the light absorbance between before plasma treatment and during the plasma treatment.

8. The measurement system according to claim 7, wherein the plasma treatment means has an RF power source for plasma generation, and the RF power source supplies a pulse-form RF power having a pulse interval controlled on the basis of measurement results by the potential difference measurement means.

9. The measurement system according to claim 7, wherein the plasma treatment means treats a dielectric film containing one element selected from the group consisting of silicon dioxide, silicon nitride, silicon carbide, aluminum oxide, zirconium oxide, cupric oxide and tungsten oxide.

10. The measurement system according to claim 9, wherein the dielectric film has a transmittance to the light within an absorption wavelength region intrinsic to the dielectric film which is 1/20 or more of transmittance to the light including the absorption wavelength region.

11. A measurement method comprising the steps of:
irradiating a dielectric film with light including wavelength of an infrared region; and
measuring a potential difference of the dielectric film charged with plasma on the basis of change in absorbance of the light within absorption wavelength range intrinsic to the dielectric film, among the light absorbed by the dielectric film.

12. The measurement method according to claim 11, wherein the step of irradiating the dielectric film with light employs a dielectric film containing one element selected from the group consisting of silicon dioxide, silicon nitride, silicon carbide, aluminum oxide, zirconium oxide, cupric oxide and tungsten oxide.

13. A measurement system comprising:
a current detection electrode exposed in an interior of a plasma treatment chamber for performing plasma treatment and electrically isolated from the plasma treatment chamber, the plasma electrode being applied with a negative voltage;
an insulation member electrically isolating the current detection electrode from the plasma treatment chamber and arranged around the current detection electrode to prevent the current detection electrode from being exposed to a material present in the plasma treatment chamber; and
contaminant measuring means for measuring an amount of contaminant present in the plasma treatment chamber on the basis of current detected by the current detection electrode.

14. The measurement system according to claim 13, wherein the insulation member has a transmission hole communicating between an interior portion and an exterior portion of the plasma treatment chamber, the current detection electrode is inserted from the exterior portion through the transmission hole in such a manner that a distal end of the current detection electrode is allowed to remain in the transmission hole.

15. The measurement system according to claim 13, wherein a diameter of the transmission hole is equal to or longer than a debye length of a reaction species generating plasma, and a distance between the distal end of the current detection electrode and an inner wall of the plasma treatment chamber is equal to or more than a mean free path of the reaction species.

16. A measurement method comprising the steps of:
preparing a current detection electrode in an interior portion of a plasma treatment chamber for performing plasma treatment in such a manner that an distal end of the electrode is exposed in a transmission hole in an insulation member, the current detection electrode being charged with a negative voltage to the plasma treatment chamber; and
measuring a contamination amount in the plasma treatment chamber on the basis of current detected by the detection electrode while deposition of a material present in the plasma treatment chamber on the current detection electrode is being prevented by inserting the current detection electrode into the transmission hole formed of the insulation member.

17. A measurement system comprising:
light radiation means for irradiating a treatment substrate with light including wavelength of an infrared region;
temperature/film-thickness measurement means for measuring temperature and film-thickness of the treatment substrate simultaneously, the temperature being measured on the basis of change in wavenumber of absorption peak within an absorption wavelength region intrinsic to the treatment substrate, among the light absorbed by the treatment substrate and previously-prepared data regarding temperature dependency of an absorption spectrum with respect to the treatment substrate; and the film-thickness being measured on the basis of change in absorbance of light within the absorption wavelength region intrinsic to the treatment substrate and previously-prepared data regarding film-thickness dependency of absorption spectrum with respect to the treatment substrate.

18. The measurement system according to claim 17, wherein the light radiation means irradiates anyone of the treatment substrate containing silicon, the treatment substrate containing silicon and oxygen, and the treatment substrate containing silicon and nitrogen with the light.

19. A measurement system comprising:
light radiation means for irradiating a treatment substrate with light including at least two wavelengths of an infrared region; and a temperature measurement means for measuring the treatment substrate on the basis of change in absorbance of light containing at least two wavelengths in an absorption wavelength region intrinsic to the treatment substrate, among the light absorbed in the treatment substrate, and on the basis of previously prepared data regarding temperature dependency of absorption spectra of at least two light wavelengths with respect to the treatment substrate.

20. The measurement system according to claim 19, further comprising previously-prepared data regarding film-thickness dependency of absorption spectra of at least two light wavelengths absorbed by the treatment substrate and further comprising film-thickness measurement means for measuring film-thickness of the treatment substrate.

21. The measurement system according to claim 20, wherein the light including at least two wavelengths of an infrared region includes a light having a wavenumber exceeding 1080 $cm^{-1}$ and a light having a wavenumber of 1080 $cm^{-1}$ or less, and the treatment substrate is formed of a thin film containing silicon and oxygen.

22. The measurement system according to claim 20, wherein the light including at least two wavelengths in an infrared region includes a wavenumber exceeding 1100 $cm^{-1}$ and a wavenumber of 1080 $cm^{-1}$, and the treatment substrate is formed of a thin film containing silicon and oxygen.

* * * * *